(12) United States Patent
Chen et al.

(10) Patent No.: US 12,218,108 B2
(45) Date of Patent: Feb. 4, 2025

(54) PACKAGE AND MANUFACTURING METHOD THEREOF

(71) Applicant: Taiwan Semiconductor Manufacturing Company, Ltd., Hsinchu (TW)

(72) Inventors: Hsien-Wei Chen, Hsinchu (TW); Jie Chen, New Taipei (TW); Ming-Fa Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/586,549

(22) Filed: Feb. 26, 2024

(65) Prior Publication Data
US 2024/0203947 A1   Jun. 20, 2024

Related U.S. Application Data

(63) Continuation of application No. 17/739,198, filed on May 9, 2022, now Pat. No. 11,942,454, which is a
(Continued)

(51) Int. Cl.
| | |
|---|---|
| *H01L 25/065* | (2023.01) |
| *H01L 21/56* | (2006.01) |
| *H01L 23/00* | (2006.01) |
| *H01L 23/31* | (2006.01) |
| *H01L 23/48* | (2006.01) |

(Continued)

(52) U.S. Cl.
CPC .......... *H01L 25/0657* (2013.01); *H01L 21/56* (2013.01); *H01L 23/3128* (2013.01); *H01L 23/481* (2013.01); *H01L 23/528* (2013.01); *H01L 24/05* (2013.01); *H01L 24/08* (2013.01); *H01L 24/19* (2013.01); *H01L 24/24* (2013.01); *H01L 24/89* (2013.01); *H01L 25/50* (2013.01); *H01L 28/60* (2013.01); *H01L 2224/0557* (2013.01); *H01L 2224/08146* (2013.01); *H01L 2224/24145* (2013.01); *H01L 2224/80001* (2013.01); *H01L 2225/06548* (2013.01); *H01L 2225/06568* (2013.01); *H01L 2225/06586* (2013.01); *H01L 2924/19041* (2013.01)

(58) Field of Classification Search
CPC ... H01L 23/481; H01L 23/5223; H01L 24/05; H01L 24/08; H01L 24/19; H01L 24/24; H01L 2224/08146; H01L 2224/80001; H01L 2224/24145; H01L 2225/06548; H01L 25/0657; H01L 25/50; H01L 25/18; H01L 2924/19041; H01L 27/0805; H01L 27/0629; H01L 29/66181
See application file for complete search history.

(56) References Cited

U.S. PATENT DOCUMENTS

| | | | |
|---|---|---|---|
| 2010/0164084 A1* | 7/2010 | Lee | H01L 25/0657 257/532 |
| 2020/0091063 A1* | 3/2020 | Chen | H01L 23/5223 |
| 2020/0161278 A1* | 5/2020 | Kuwabara | H01L 24/92 |

* cited by examiner

*Primary Examiner* — Victor A Mandala
*Assistant Examiner* — Lawrence C Tynes, Jr.
(74) *Attorney, Agent, or Firm* — JCIPRNET

(57) ABSTRACT

A package includes a first die, a second die, and an encapsulant. The first die includes a first capacitor. The second die includes a second capacitor. The second die is stacked on the first die. The first capacitor is spatially separated from the second capacitor. The first capacitor is electrically connected to the second capacitor. The encapsulant laterally encapsulates the second die.

20 Claims, 34 Drawing Sheets

Related U.S. Application Data continuation of application No. 16/801,156, filed on Feb. 26, 2020, now Pat. No. 11,362,065.

(51) Int. Cl.
*H01L 23/528* (2006.01)
*H01L 25/00* (2006.01)
*H01L 49/02* (2006.01)

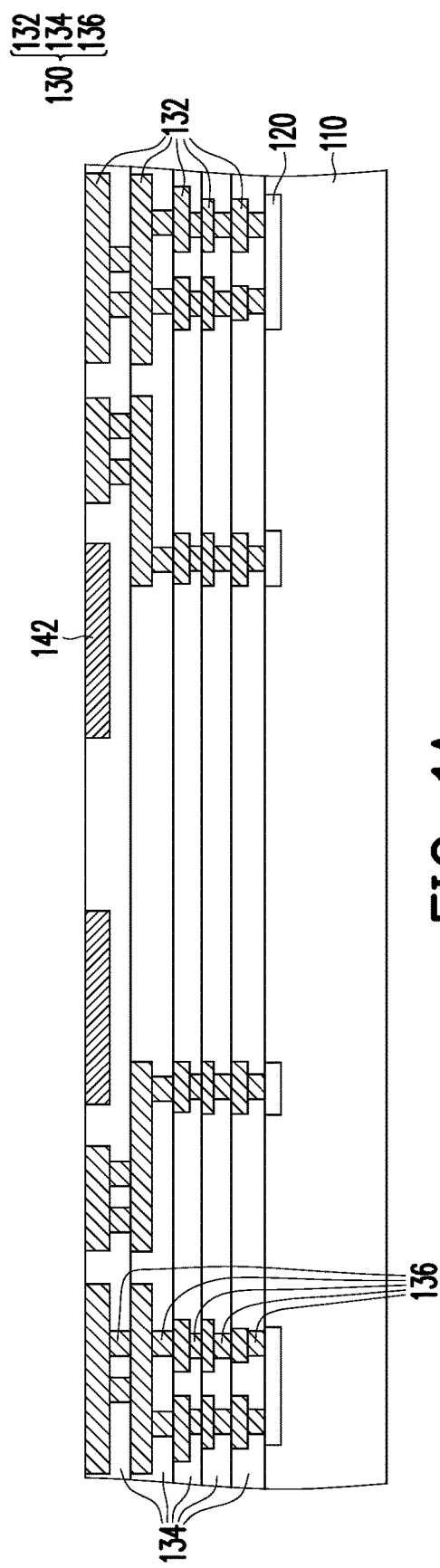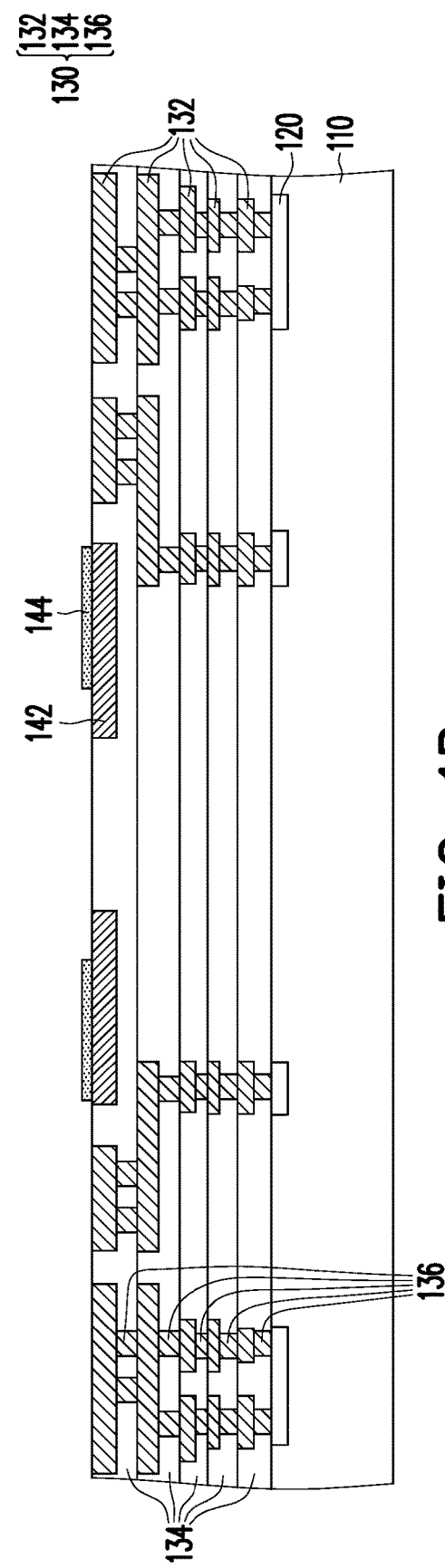

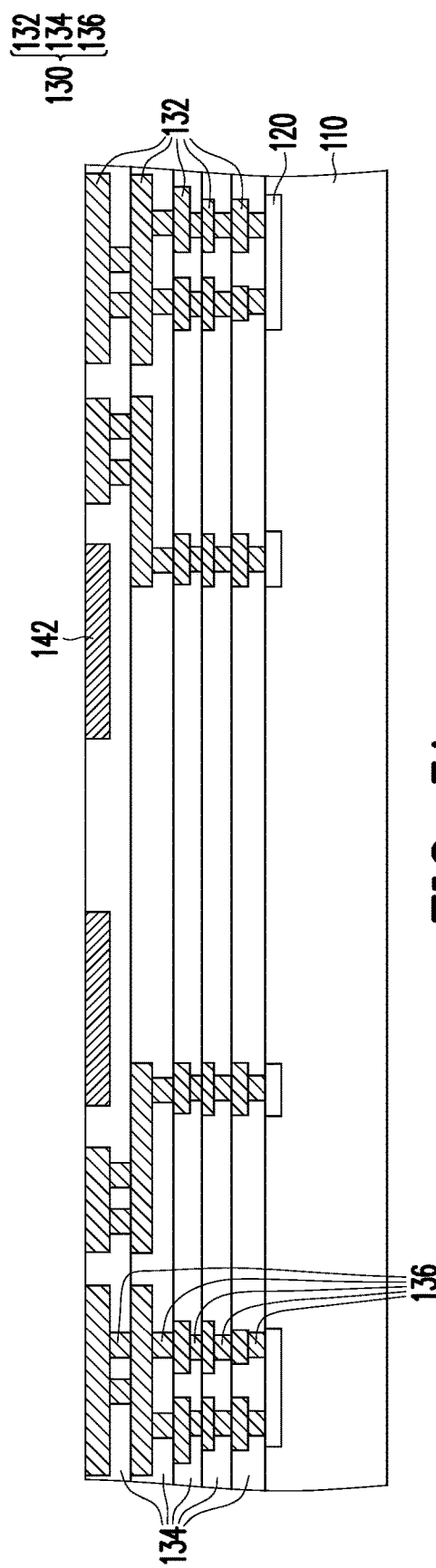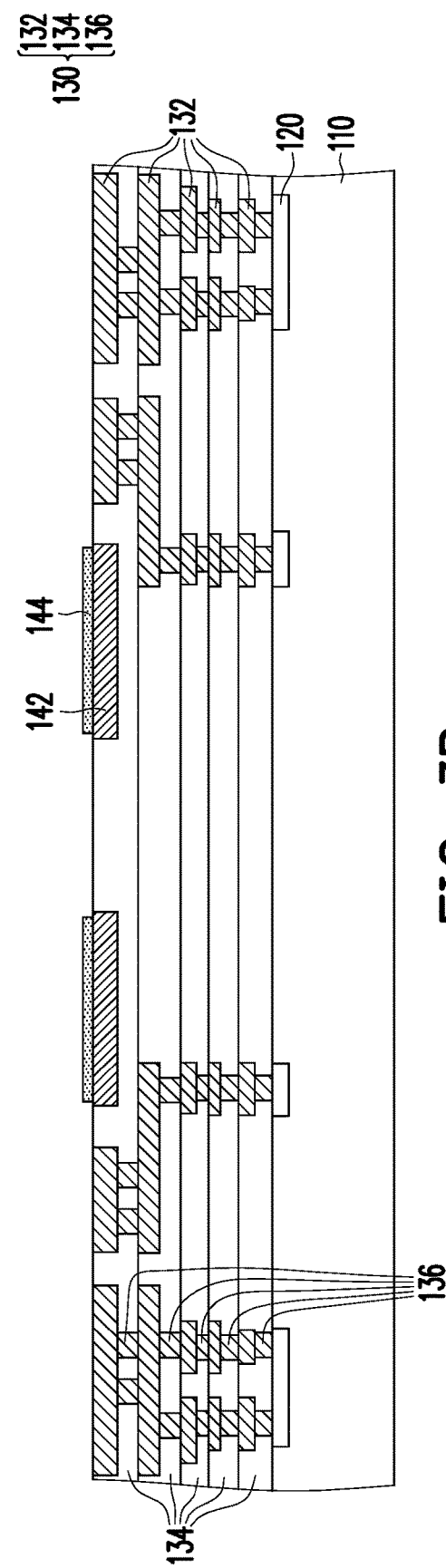
FIG. 3A
FIG. 3B

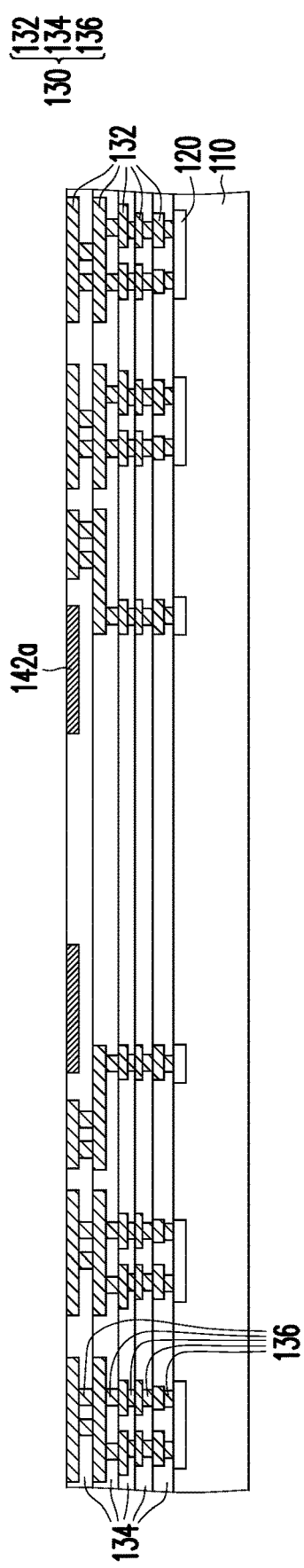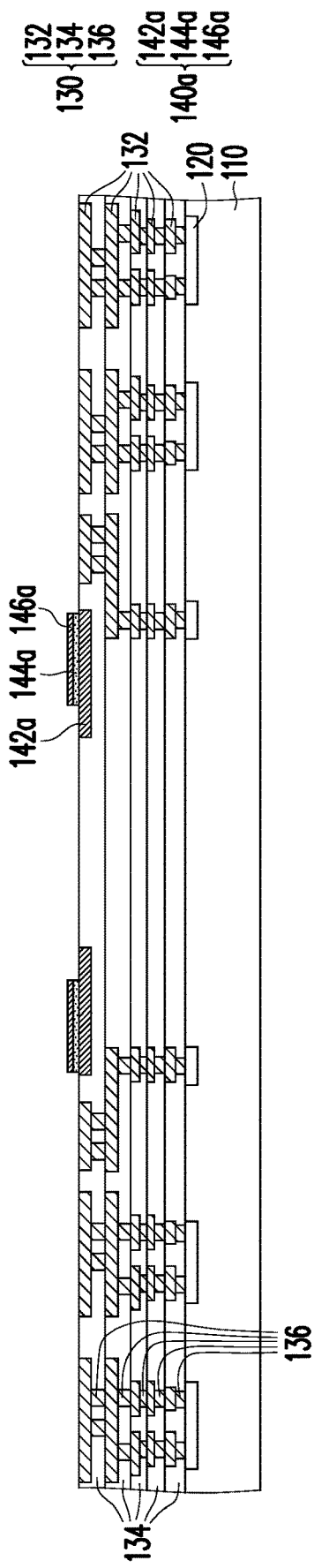
FIG. 5A
FIG. 5B

PACKAGE AND MANUFACTURING METHOD THEREOF

CROSS-REFERENCE TO RELATED APPLICATION

This application is a continuation application of and claims the priority benefit of a prior application Ser. No. 17/739,198, filed on May 9, 2022, now allowed. The prior application Ser. No. 17/739,198 is a continuation application of and claims the priority benefit of a prior application Ser. No. 16/801,156, filed on Feb. 26, 2020, now patented. The entirety of each of the above-mentioned patent applications is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for the wafer level packaging. Integration of multiple semiconductor devices has become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1L are schematic cross-sectional views illustrating a manufacturing process of a package in accordance with some embodiments of the disclosure.

FIG. 3A to FIG. 3L are schematic cross-sectional views illustrating a manufacturing process of a package in accordance with some alternative embodiments of the disclosure.

FIG. 5A to FIG. 5M are schematic cross-sectional views illustrating a manufacturing process of a package in accordance with some alternative embodiments of the disclosure.

DETAILED DESCRIPTION

Figure 1C:
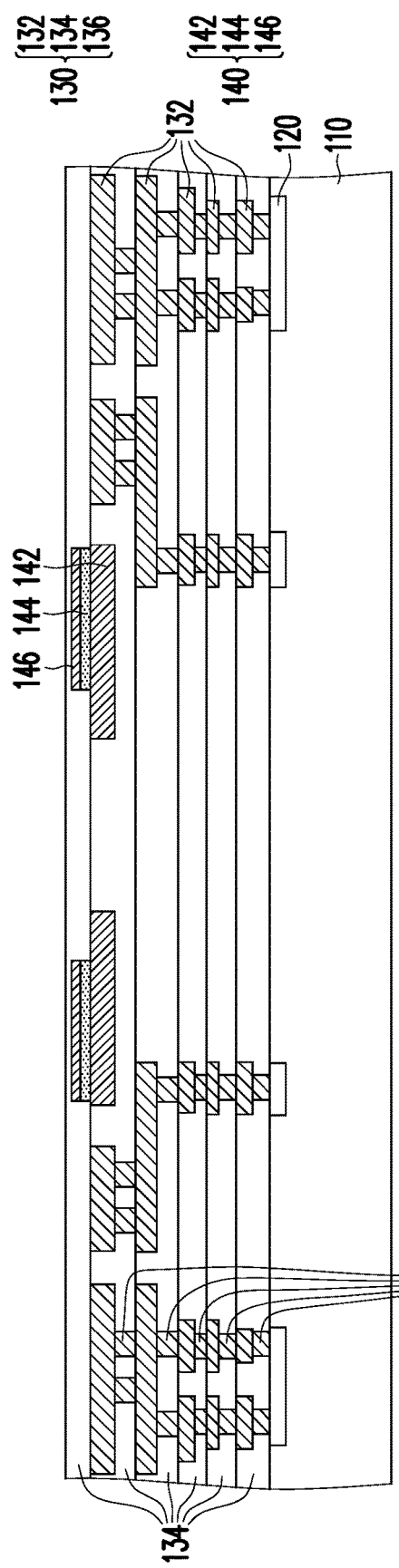

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1L are schematic cross-sectional views illustrating a manufacturing process of a package 10 in accordance with some embodiments of the disclosure. Referring to FIG. 1A, a semiconductor substrate 110 is provided. The semiconductor substrate 110 may be made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The semiconductor substrate 110 may be a bulk silicon substrate, a silicon-on-insulator (SOI) substrate, or a germanium-on-insulator (GOI) substrate. In some embodiments, the semiconductor substrate 110 has a plurality of devices 120 formed therein. The devices 120 may include active components (e.g., transistors or the like) and/or passive components (e.g., resistors, capacitors, inductors, or the like). In some embodiments, the devices 120 are separated by shallow trench isolation (STI; not shown) located between two adjacent devices 120. That is, in some embodiments, the STI are also embedded in the semiconductor substrate 110.

As illustrated in FIG. 1A, an interconnection structure 130 is formed on the semiconductor substrate 110. In some embodiments, the interconnection structure 130 includes a plurality of conductive patterns 132, a plurality of dielectric layers 134, and a plurality of conductive vias 136. As illustrated in FIG. 1A, the conductive patterns 132 are embedded in the dielectric layers 134. On the other hand, the conductive vias 136 penetrate through the dielectric layer 134. In some embodiments, the conductive patterns 132 located at different level heights are connected to each other through the conductive vias 136. In other words, the conductive patterns 132 are electrically connected to each other through the conductive vias 136. In some embodiments, the bottommost conductive vias 136 are connected to the device 120 embedded in the semiconductor substrate 110. In other words, the bottommost conductive vias 136 establish electrical connection between the device 120 and the conductive patterns 132 of the interconnection structure 130. In some embodiments, the bottommost conductive vias 136 may be referred to as "contact structures" of the device 120.

In some embodiments, a material of the dielectric layers 134 includes polyimide, epoxy resin, acrylic resin, phenol resin, benzocyclobutene (BCB), polybenzooxazole (PBO), or any other suitable polymer-based dielectric material. Alternatively, the dielectric layers 134 may be formed of oxides or nitrides, such as silicon oxide, silicon nitride, or the like. The dielectric layers 134, for example, may be formed by suitable fabrication techniques such as spin-on coating, chemical vapor deposition (CVD), plasma-enhanced chemical vapor deposition (PECVD), or the like. In some embodiments, a material of the conductive patterns 132 and the conductive vias 136 includes aluminum, titanium, copper, nickel, tungsten, or alloys thereof. The conductive patterns 132 and the conductive vias 136 may be formed by, for example, electroplating, deposition, and/or photolithography and etching. In some embodiments, the conductive patterns 132 and the underlying conductive vias 136 may be formed simultaneously. It should be noted that the number of the dielectric layers 134, the number of the conductive patterns 132, and the number of the conductive vias 136 illustrated in FIG. 1A are merely for illustrative purposes, and the disclosure is not limited thereto. In some alternative embodiments, fewer or more layers of the dielectric layers 132, the conductive patterns 132, or the conductive vias 136 may be formed depending on the circuit design.

In some embodiments, a plurality of metal layers 142 is formed in the interconnection structure 130. For example, the metal layers 142 are embedded in the topmost dielectric layer 134 shown in FIG. 1A. In some embodiments, the metal layers 142 and the topmost conductive patterns 132 shown in FIG. 1A may be simultaneously formed. That is, the metal layers 142 and the topmost conductive patterns 132 shown in FIG. 1A may be formed by the same material during the same process step. However, the disclosure is not limited thereto. In some alternative embodiments, the metal layers 142 may be formed prior to or after the formation of the conductive patterns 132. For example, the metal layers 142 and the conductive patterns 132 may be made of different materials. In some embodiments, a material of the metal layers 142 includes aluminum, titanium, copper, nickel, tungsten, or alloys thereof. In some embodiments, the metal layers 142 may be formed by, for example, electroplating, deposition, and/or photolithography and etching. It should be noted that at this stage, the formation of the interconnection structure 130 is not completed yet.

Referring to FIG. 1B, a plurality of insulating layers 144 is formed over the metal layers 144. As illustrated in FIG. 1B, each insulating layer 144 partially covers the corresponding metal layer 142. In some embodiments, a material of the insulating layer 144 is different from the material of the dielectric layers 134 of the interconnection structure 130. For example, the insulating layers 144 are made of a high-k dielectric material. In some embodiments, the high-k dielectric material refers to dielectric materials having a dielectric constant greater than about 7.0, and may include a metal oxide or a silicate of Hf, Al, Zr, La, Mg, Ba, Ti, Pb, and combinations thereof. In some embodiments, the insulating layers 144 may be formed by, for example, deposition, and/or photolithography and etching. In some embodiments, the insulating layers 144 may be deposited through Molecular-Beam Deposition (MBD), atomic layer deposition (ALD), PECVD, thermal oxidation, UV-ozone oxidation, a combination thereof, or the like. In some embodiments, each insulating layer 144 is formed to have a thickness ranges between approximately 100 Å and approximately 300 Å.

Referring to FIG. 1C, a plurality of metal layers 146 is formed on the insulating layers 144. In some embodiments, the metal layers 146 may be formed by, for example, electroplating, deposition, and/or photolithography and etching. In some embodiments, a material of the metal layers 146 may be the same as the material of the metal layers 142. However, the disclosure is not limited thereto. In some alternative embodiments, the material of the metal layers 146 may be different from the material of the meal layers 142. In some embodiments, a material of the metal layers 146 includes aluminum, titanium, copper, nickel, tungsten, or alloys thereof. In some embodiments, each metal layer 146 may be formed to completely cover the corresponding insulating layer 144. For example, sidewalls of each metal layer 146 are aligned with sidewalls of the corresponding insulating layer 144. In some embodiments, the metal layers 142, the insulating layers 144, and the metal layers 146 are stacked in sequential order to form "MIM (metal-insulator-metal) structures." That is, in some embodiments, the metal layer 142, the insulating layer 144, and the metal layer 146 are collectively referred to as a capacitor 140. In some embodiments, the metal layer 142 may serve as a bottom electrode of the capacitor 140 while the metal layer 146 may serve as a top electrode of the capacitor 140.

After the formation of the capacitors 140, a dielectric layer 134 (the topmost dielectric layer 134 shown in FIG. 1C) is formed over the conductive patterns 132 to cover the capacitors 140. It should be noted that said dielectric layer 134 may be considered as part of the interconnection structure 130. In other words, the capacitors 140 are embedded in the interconnection structure 130.

Figure 1D:
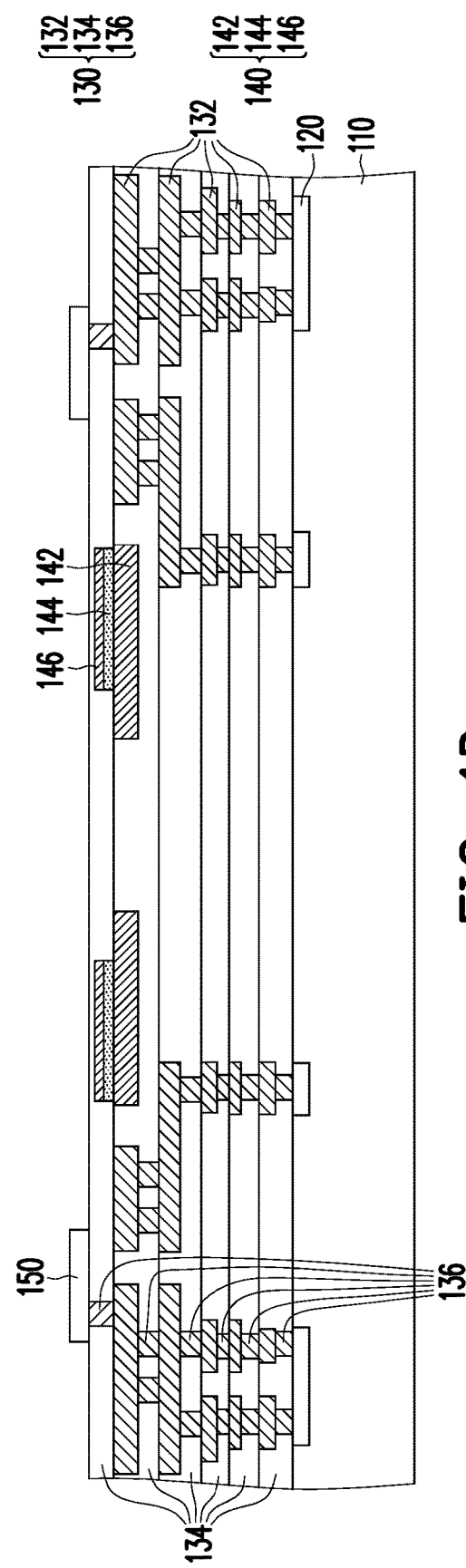

Referring to FIG. 1D, a plurality of conductive vias 136 (the topmost conductive vias 136 shown in FIG. 1D) is formed to penetrate through the topmost dielectric layer 134. It should be noted that said conductive vias 136 may be considered as part of the interconnection structure 130. At this stage, the formation of the interconnection structure 130 is completed. In some embodiments, the topmost conductive patterns 132 may be referred to as "top metal layer" of the interconnection structure 130. In other words, the metal layers 142 of the capacitors 140 are located at the same level height as the top metal layer of the interconnection structure 130.

After the interconnection structure 130 is formed, a plurality of conductive pads 150 is formed over the interconnection structure 130. In some embodiments, the conductive pads 150 are electrically connected to the conductive patterns 132 of the interconnection structure 130 through the topmost conductive vias 136. In some embodiments, the conductive pads 150 are used to establish electrical connection with other components (not shown) or dies (not shown) subsequently formed or provided. In some alternative embodiments, the conductive pads 150 may be a test pad used to probe the subsequently formed wafer substrate WS (shown in FIG. 1E) in which the conductive pads 150 are included. In some embodiments, the conductive pads 150 may be aluminum pads, copper pads, or other suitable metal pads. It should be noted that the number and the shape of the conductive pads 150 illustrated in FIG. 1D are merely for illustrative purposes, and the disclosure is not limited thereto. In some alternative embodiments, the number and shape of the conductive pad 150 may be selected based on demand.

Figure 1E:
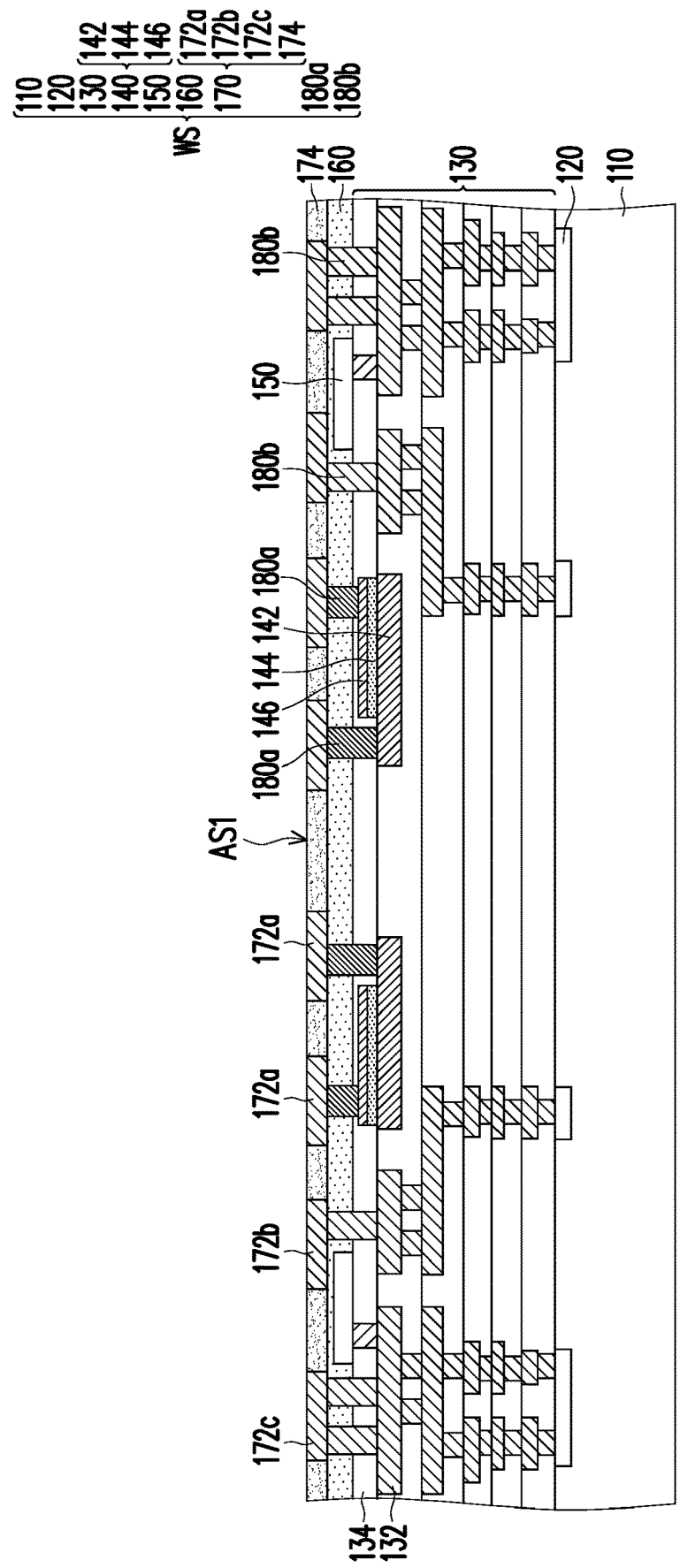

Referring to FIG. 1E, a passivation layer 160 is formed over the interconnection structure 130 and the conductive pads 150. As illustrated in FIG. 1E, the conductive pads 150 are embedded in the passivation layer 160. In some embodiments, a material of the passivation layer 160 includes oxides, such as silicon oxide or the like. Alternatively, the passivation layer 160 may include polyimide, epoxy resin, acrylic resin, phenol resin, BCB, PBO, or any other suitable polymer-based dielectric material. The passivation layer 160, for example, may be formed by suitable fabrication techniques, such as spin-on coating, CVD, PECVD, or the like.

After the passivation layer 160 is formed, a plurality of bonding vias 180a, 180b and a bonding layer 170 are formed to obtain a wafer substrate WS. As illustrated in FIG. 1E, the bonding vias 180a are formed to penetrate through the passivation layer 160 and at least part of the topmost dielectric layer 134 of the interconnection structure 130 to establish electrical connection with the capacitors 140. For example, one of the bonding vias 180a is directly in contact with the metal layer 146, and another one of the bonding vias 180a is directly in contact with the metal layer 142. In some embodiments, the bonding vias 180b are formed to penetrate through the passivation layer 160 and the topmost dielectric layer 134 of the interconnection structure 130 to establish electrical connection with the conductive patterns 132 of the interconnection structures 130.

In some embodiments, the bonding layer 170 is formed over the passivation layer 160 and the bonding vias 180a, 180b. In other words, the passivation layer 160 is sandwiched between the interconnection structure 130 and the bonding layer 170. In some embodiments, the bonding layer 170 includes a plurality of bonding pads 172a, a plurality of bonding pads 172b, a plurality of bonding pads 172c, and a dielectric layer 174. In some embodiments, the bonding pads 172a, the bonding pads 172b, and the bonding pads 172c are embedded in the dielectric layer 174. The relative configuration of the bonding pads 172a with respect to the capacitors 140 will be described below in conjunction with FIG. 2.

Figure 2:
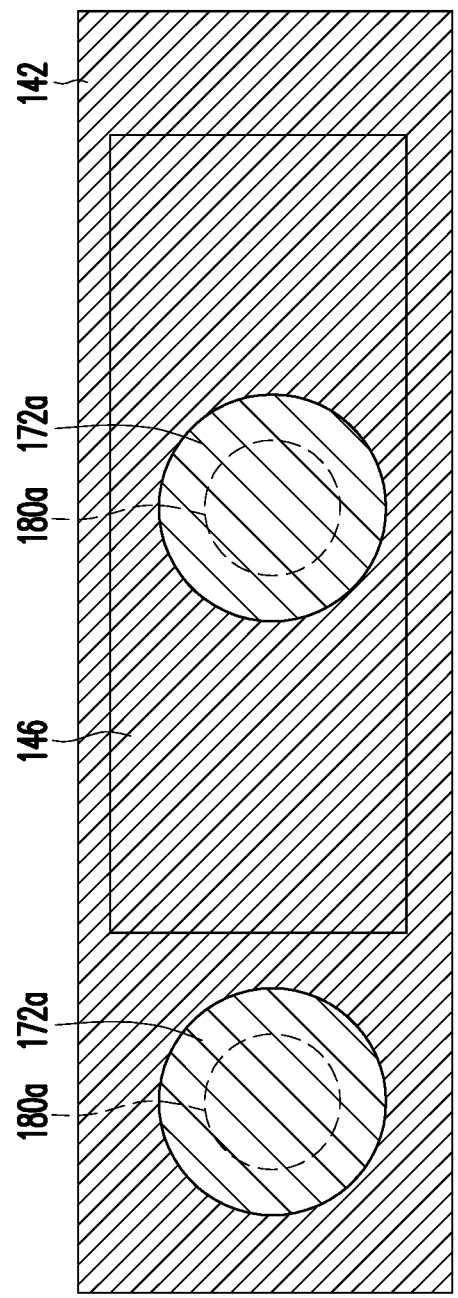
FIG. 2 is a partial top view of FIG. 1E.

FIG. 2 is a partial top view of FIG. 1E. Referring to FIG. 1E and FIG. 2, the bonding pads 172a are located directly above the capacitor 140. In some embodiments, one of the bonding pads 172a is located directly above the metal layer 146, and another one of the bonding pads 172a is located directly above the metal layer 142. In some embodiments, the bonding vias 180a connect the bonding pads 172a of the bonding layer 170 and the capacitors 140. For example, one of the bonding vias 180a penetrates through the passivation layer 160 and at least part of the topmost dielectric layer 134 of the interconnection structure 130 to establish electrical connection between one of the bonding pads 172a and the metal layer 142 of the capacitor 140, and another one of the bonding vias 180a penetrates through the passivation layer 160 and at least part of the topmost dielectric layer 134 of the interconnection structure 130 to establish electrical connection between another one of the bonding pads 172a and the metal layer 146 of the capacitor 140. That is, the bonding pads 172a are electrically connected to the capacitors 140 through the bonding vias 180a.

As illustrated in FIG. 1E, the bonding pads 172b and the bonding pads 172c are not located directly above the capacitor 140. In some embodiments, the bonding pads 172b and the bonding pads 172c are located directly above the conductive patterns 132 of the interconnection structure 130. For example, the bonding vias 180b connect the bonding pads 172b, 172c of the bonding layer 170 and the conductive patterns 132 of the interconnection structure 130. That is, the bonding pads 172b and the bonding pads 172c are electrically connected to the conductive patterns 132 of the interconnection structure 130 through the bonding vias 180b. In some embodiments, the bonding pads 172a and the bonding pads 172b may be utilized in the subsequent hybrid bonding process. On the other hand, the bonding pads 172c does not participate in the subsequent hybrid bonding process. In some embodiments, the bonding layer 170 may further include a plurality of dummy bonding pads (not shown). In some embodiments, the dummy bonding pads may be electrically floating and may serve the purpose of maintaining metal distribution to control warpage.

In some embodiments, the bonding vias 180a, 180b and the bonding pads 172a, 172b, 172c may be formed via a dual damascene process. For example, the dielectric layer 174 is first formed on the passivation layer 160. In some embodiments, a material of the dielectric layer 174 includes oxides, such as silicon oxide or the like. Alternatively, the dielectric layer 174 may include polyimide, epoxy resin, acrylic resin, phenol resin, BCB, PBO, or any other suitable polymer-based dielectric material. The dielectric layer 174, for example, may be formed by suitable fabrication techniques, such as spin-on coating, CVD, PECVD, or the like. Subsequently, trenches and via holes (not shown) are formed in the dielectric layer 174 of the bonding layer 170, the passivation layer 160, and the topmost dielectric layer 134 of the interconnection structure 130 by removing portions of theses layers. In some embodiments, a width of the trench is greater than a width of the via hole. Thereafter, a conductive material (not shown) is filled into the via holes to form the bonding vias 180a, 180b. Meanwhile, the conductive material (not shown) also fills into the trenches to from the bonding pads 172a, 172b, 172c. That is, the bonding vias 180a, 180b and the bonding pads 172a, 172b, 172c are formed by simultaneously filling via holes and overlying trenches (not shown). However, the disclosure is not limited thereto. In some alternative embodiments, the bonding vias 180a, 180b may be formed before the bonding pads 172a, 172b, 172c and the dielectric layer 174. In some embodiments, a width of each bonding pad 172a may be greater than a width of each underlying bonding via 180a. Similarly, a width of each bonding pad 172b, 172c may be greater than a width of each underlying bonding via 180b. In some embodiments, the bonding vias 180a, 180b and the bonding pads 172a, 172b, 172c include the same material. For example, the bonding vias 180a, 180b and the bonding pads 172a, 172b, 172c may be made of aluminum, titanium, copper, nickel, tungsten, or alloys thereof. In some embodiments, the bonding pads 172a, the bonding pads 172b, and the bonding pads 172c may be simultaneously formed.

In some embodiments, top surfaces of the boning pads 172a, top surfaces of the bonding pads 172b, top surfaces of the bonding pads 172c, and a top surface of the dielectric layer 174 may be collectively referred to as an active surface AS1 of the wafer substrate WS. As shown in FIG. 1E, the top surfaces of the boning pads 172a, the top surfaces of the bonding pads 172b, the top surfaces of the bonding pads 172c, and the top surface of the dielectric layer 174 are substantially located at the same level height to provide an appropriate active surface AS1 for hybrid bonding.

Although not illustrated, in some embodiments, some of the bonding vias 180b may be disposed directly above the conductive pads 150 to establish electrical connection between the conductive pads 150 and other elements (for example, the bonding pads 172b directly above the conductive pads 150). That is, in some embodiments, some of the conductive pads 150 are electrically floating while some of the conductive pads 150 are able to transmit signal.

Figure 1F:
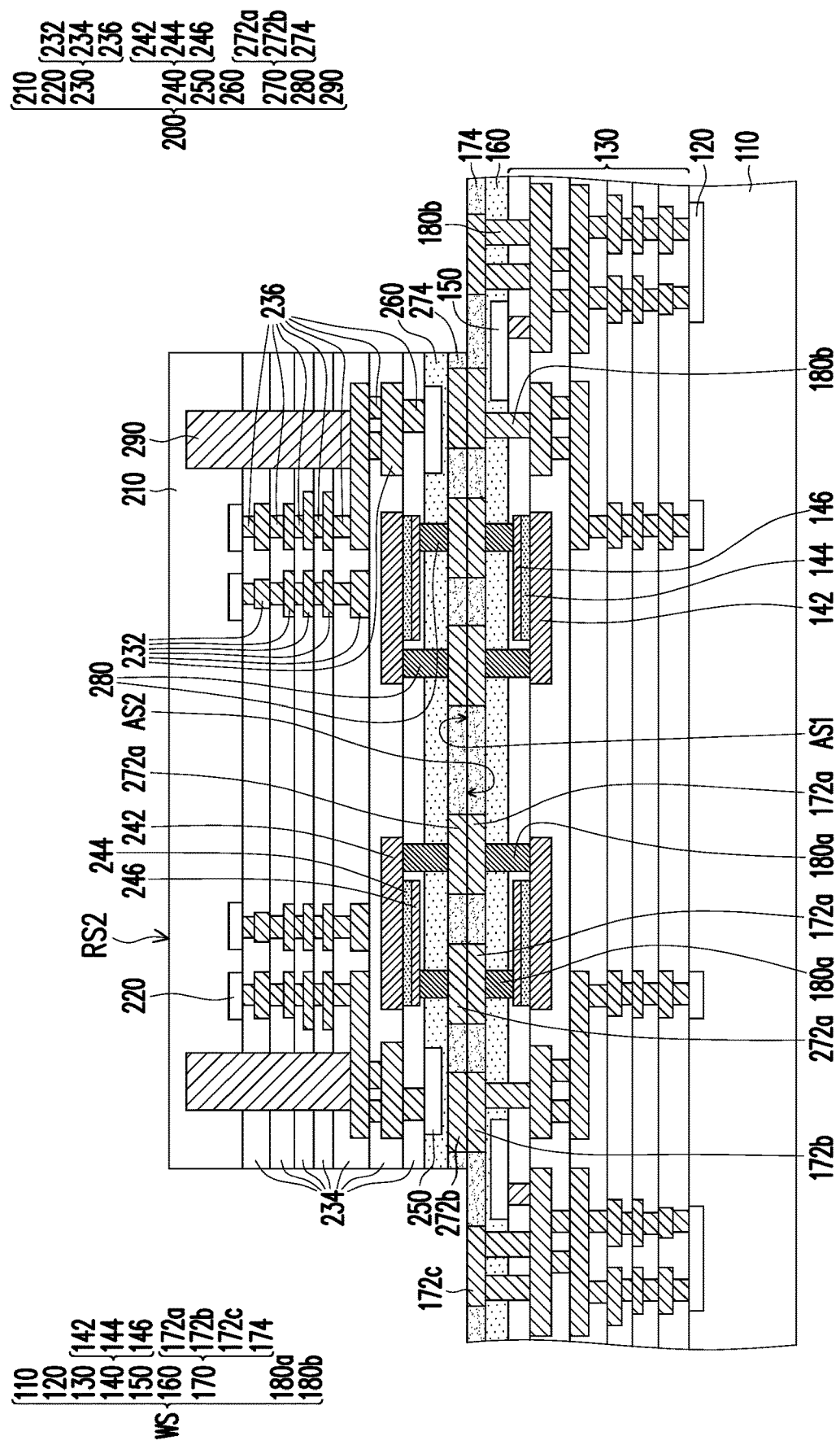

Referring to FIG. 1F, a die 200 is provided. In some embodiments, the die 200 includes a semiconductor substrate 210, a plurality of devices 220, an interconnection structure 230, a plurality of capacitors 240, a plurality of conductive pads 250, a passivation layer 260, a bonding layer 270, a plurality of bonding vias 280, and a plurality of through semiconductor vias (TSV) 290. In some embodiments, the devices 220 are formed in the semiconductor substrate 210. The semiconductor substrate 210 and the devices 220 of the die 200 are respectively similar to the semiconductor substrate 110 and the devices 110 of the wafer substrate WS, so the detailed descriptions thereof are omitted herein.

As illustrated in FIG. 1F, the interconnection structure 230 is disposed on the semiconductor substrate 210. In some embodiments, the interconnection structure 230 is electrically connected to the devices 220 formed in the semiconductor substrate 210. In some embodiments, the interconnection structure 230 includes a plurality of conductive patterns 232, a plurality of dielectric layers 234, and a plurality of conductive vias 236. The conductive patterns 232, the dielectric layers 234, and the conductive vias 236 of the interconnection structure 230 are respectively similar to the conductive patterns 132, the dielectric layers 134, and the conductive vias 136 of the interconnection structure 130, so the detailed descriptions thereof are omitted herein.

In some embodiments, the capacitors 240 are embedded in the interconnection structure 230. As illustrated in FIG. 1F, each capacitor 240 includes a metal layer 246, an insulating layer 244, and a metal layer 242 stacked in sequential order. In some embodiments, the metal layer 242, the insulating layer 244, and the metal layer 246 of the capacitor 240 are respectively similar to the metal layer 142, the insulating layer 144, and the metal layer 146 of the capacitor 140, so the detailed descriptions thereof are omitted herein In some embodiments, the conductive pads 250, the passivation layer 260, and the bonding vias 280 are formed over the interconnection structure 230. In some embodiments, the conductive pads 250, the passivation layer 260, and the bonding vias 280 of the die 200 are respectively similar to the conductive pad 150, the passivation layer 160, and the bonding via 180a of the wafer substrate WS, so the detailed descriptions thereof are omitted herein. In some embodiments, the conductive pads 250 are electrically connected to the interconnection structure 230. In some embodiments, the conductive pads 250 are embedded in the passivation layer 260. As illustrated in FIG. 1F, the bonding vias 280 are formed to penetrate through the passivation layer 260 and at least part of the bottommost dielectric layer 234 of the interconnection structure 230 to establish electrical connection with the capacitors 240. For example, one of the bonding vias 280 is directly in contact with the metal layer 246 of the capacitor 240, and another one of the bonding vias 280 is directly in contact with the metal layer 242 of the capacitor 240.

As illustrated in FIG. 1F, the bonding layer 270 is formed over the passivation layer 260 and the bonding vias 280. In other words, the passivation layer 260 is sandwiched between the interconnection structure 230 and the bonding layer 270. In some embodiments, the bonding layer 270 includes a plurality of bonding pads 272a, a plurality of bonding pads 272b, and a dielectric layer 274. The bonding pads 272a, the bonding pads 272b, and the dielectric layer 273 of the bonding layer 270 are respectively similar to the bonding pads 172a, the bonding pads 172b, and the dielectric layer 174 of the bonding layer 170, so the detailed descriptions thereof are omitted herein. In some embodiments, the bonding vias 280 connect the bonding pads 272a of the bonding layer 270 and the capacitors 240. For example, one of the bonding vias 280 penetrates through the passivation layer 260 and at least part of the bottommost dielectric layer 234 of the interconnection structure 230 to establish electrical connection between one of the bonding pads 272a and the metal layer 242 of the capacitor 240, and another one of the bonding vias 280 penetrates through the passivation layer 260 and at least part of the bottommost dielectric layer 234 of the interconnection structure 230 to establish electrical connection between another one of the bonding pads 272a and the metal layer 246 of the capacitor 240. That is, the bonding pads 272a are electrically connected to the capacitor 240 through the bonding vias 280. In some embodiments, the bonding layer 270 may further include a plurality of dummy bonding pads (not shown). In some embodiments, the dummy bonding pads may be electrically floating and may serve the purpose of maintaining metal distribution to control warpage. In some embodiments, the die 200 further includes additional bonding vias (not shown) connecting the bonding pads 272b and the conductive patterns 232 of the interconnection structure 230.

In some embodiments, the TSVs 290 are embedded in the semiconductor substrate 210 and the dielectric layers 234 of the interconnection structure 230. That is, the TSVs 290 extend from the semiconductor substrate 210 to the interconnection structure 230. For example, a portion of each TSV 290 is embedded in the semiconductor substrate 210 while another portion of each TSV 290 is embedded in the dielectric layers 234 of the interconnection structure 230. In some embodiments, the TSVs 290 are directly in contact with the conductive patterns 232 to render electrical connection with the interconnection structure 230.

In some embodiments, the die 200 may be capable of performing storage functions. For example, the die 200 may be Dynamic Random Access Memory (DRAM), Resistive Random Access Memory (RRAM), Static Random Access Memory (SRAM), or the like. However, the disclosure is not limited thereto. In some alternative embodiments, the die 200 may be Central Process Unit (CPU) dies, Graphic Process Unit (GPU) dies, Field-Programmable Gate Array (FPGA), or the like.

As illustrated in FIG. 1F, bottom surfaces of the bonding pads 272a, bottom surfaces of the bonding pads 272b, and a bottom surface of the dielectric layer 274 may be collectively referred to as an active surface AS2 of the die 200. On the other hand, a surface of the die 200 opposite to the active surface AS2 may be referred to as a rear surface RS2 of the die 200. As shown in FIG. 1F, the bottom surfaces of the bonding pads 272a, the bottom surfaces of the bonding pads 272b, and the bottom surface of the dielectric layer 274 are substantially located at the same level height to provide an appropriate active surface AS2 for hybrid bonding.

As illustrated in FIG. 1F, the die 200 is placed on the wafer substrate WS such that the die 200 is bonded to the wafer substrate WS. For simplicity, one die 200 is shown in FIG. 1F. However, it should be understood that more than one dies may be bonded to the wafer substrate WS. In some embodiments, the die 200 may be bonded to the wafer substrate WS through a hybrid bonding process. In some embodiments, a temperature of the hybrid bonding process ranges from about 150° C. to about 400° C. The hybrid bonding process will be described in detail below.

In some embodiments, the die 200 may be picked-and-placed onto the active surface AS1 of the wafer substrate WS such that the die 200 is electrically connected to the wafer substrate WS. In some embodiments, the die 200 is placed such that the active surface AS2 of the die 200 is in contact with the active surface AS1 of the wafer substrate WS.

Meanwhile, the bonding pads 272a of the die 200 are substantially aligned and in direct contact with the corresponding bonding pads 172a of the wafer substrate WS, and the boning pads 272b of the die 200 are substantially aligned and in direct contact with the corresponding bonding pads 172b of the wafer substrate WS. In some embodiments, to facilitate the hybrid bonding between the die 200 and the wafer substrate WS, surface preparation for bonding surfaces (i.e. the active surface AS1 and the active surface AS2) of the wafer substrate WS and the die 200 may be performed. The surface preparation may include surface cleaning and activation, for example. Surface cleaning may be performed on the active surfaces AS1, AS2 to remove particles on the bonding surface of the dielectric layer 174, the bonding surfaces of the bonding pads 172a, 172b, the bonding surface of the dielectric layer 274, and the bonding surfaces of the bonding pads 272a, 272b. In some embodiments, the active surfaces AS1, AS2 may be cleaned by wet cleaning, for example. Not only particles are removed, but also native oxide formed on the bonding surfaces of the bonding pads 172a, 172b and the bonding pads 272a, 272b may be removed. The native oxide formed on the bonding surfaces of the bonding pads 172a, 172b and the bonding pads 272a, 272b may be removed by chemicals used in wet cleaning processes, for example.

After cleaning the active surfaces AS1 of the wafer substrate WS and the active surfaces AS2 of the die 200, activation of the bonding surfaces of the dielectric layer 174 and the dielectric layer 274 may be performed for development of high bonding strength. In some embodiments, plasma activation may be performed to treat the bonding surfaces of the dielectric layer 174 and the dielectric layer 274. When the activated bonding surface of the dielectric layer 174 is in contact with the activated bonding surface of the dielectric layer 274, the dielectric layer 174 of the wafer substrate WS and the dielectric layer 274 of the die 200 are pre-bonded.

After pre-bonding the die 200 onto the wafer substrate WS, hybrid bonding of the die 200 and the wafer substrate WS is performed. The hybrid bonding of the die 200 and the wafer substrate WS may include a thermal treatment for dielectric bonding and a thermal annealing for conductor bonding. In some embodiments, the thermal treatment for dielectric bonding is performed to strengthen the bonding between the dielectric layer 174 and the dielectric layer 274. For example, the thermal treatment for dielectric bonding may be performed at temperature ranging from about 200° C. to about 400° C. After performing the thermal treatment for dielectric bonding, the thermal annealing for conductor bonding is performed to facilitate the bonding between the bonding pads 172a, 172b and the bonding pads 272a, 272b. For example, the thermal annealing for conductor bonding may be performed at temperature ranging from about 150° C. to about 400° C. After performing the thermal annealing for conductor bonding, the dielectric layer 174 is hybrid bonded to the dielectric layer 274, the bonding pads 172a are hybrid bonded to the bonding pads 272a, and the bonding pads 172b are hybrid bonded to the bonding pads 272b. For example, the dielectric layer 174 is directly in contact with the dielectric layer 274. Similarly, the bonding pads 172a are directly in contact with the bonding pads 272a, and the bonding pads 172b are directly in contact with the bonding pads 272b. As such, the bonding layer 170 of the wafer substrate WS is hybrid bonded to the bonding layer 270 of the die 200. Although FIG. 1F illustrated that the bonding pads 172a, 172b and the bonding pads 272a, 272b have sharp corners (the sidewalls are perpendicular to the top/bottom surfaces), the disclosure is not limited thereto. In some alternative embodiments, after the bonding pads 172a, 172b are hybrid bonded to the bonding pads 272a, 272b, corner rounding of the bonding pads may occur. For example, the corners of the bonding pads 172a, 172b facing the bonding pads 272a, 272b are rounded. Similarly, the corners of the bonding pads 272a, 272b facing the bonding pads 172a, 172b are also rounded. That is, edges of the top surface of each bonding pad 172a, 172b are rounded. Similarly, edges of the bottom surface of each bonding pad 272a, 272b are also rounded. Moreover, although FIG. 1F illustrated that the bonding pads 172a and the bonding pads 272a have the same width and the bonding pads 172b and the bonding pads 272b have the same width, the disclosure is not limited thereto. In some alternative embodiments, the width of each bonding pad 172a may be smaller than or larger than the width of each bonding pad 272a. Similarly, the width of each bonding pads 172b may be smaller than or larger than the width of each bonding pads 272b.

As illustrated in FIG. 1F, the bonding pads 172c do not involve in the hybrid bonding process. For example, after the hybrid bonding process, the bonding pads 172c are still exposed. In some embodiments, since the wafer substrate WS is in wafer form and the die 200 is in chip form, the hybrid bonding process in FIG. 1F may be referred to as a "chip-on-wafer bonding process." In some embodiments, since the active surface AS1 of the wafer substrate WS are hybrid bonded to the active surface AS2 of the die 200, the bonding between the wafer substrate WS and the die 200 may be considered as face-to-face bonding.

As illustrated in FIG. 1F, each capacitor 240 is overlapped with the corresponding capacitor 140 along a vertical direction perpendicular to the active surface AS2 of the die 200. That is, a vertical projection of the capacitor 240 is overlapped with the capacitor 140. In some embodiments, the capacitor 140 and the capacitor 240 are arranged in mirror symmetry. In some embodiments, the capacitor 140 is electrically connected to the corresponding capacitor 240 through the bonding vias 180a, the bonding layer 170, the bonding layer 270, and the bonding vias 280. For example, the capacitor 140 is electrically connected to the corresponding capacitor 240 sequentially through the bonding vias 180a, the bonding pads 172a, the bonding pads 272a, and the bonding vias 280. In some embodiments, the capacitor 140 and the corresponding capacitor 240 are connected in series to form a passive device (i.e. another capacitor). The passive device has an effective capacitance substantially equal to a sum of the capacitances of the capacitor 140 and the corresponding capacitor 240. In other words, the capacitor 140 may be referred to as a first portion of the passive device while the capacitor 240 may be referred to as a second portion of the passive device. In some embodiments, the passive device extends from the die 200 to the wafer substrate WS. That is, the passive device may be referred to as "dual side stacking MIM structure." Since the passive device is constituted by the capacitor 140 located in the wafer substrate WS and the capacitor 240 located in the die 200, and the capacitor 140 and the capacitor 240 are arranged in a stacked manner, the area requirement for the individual capacitor 140 and the individual capacitor 240 may be sufficiently reduced to render desired effective capacitance in the passive device. As such, the obtained package may be miniaturized, and more components may be integrated into a given area.

Figure 1G:
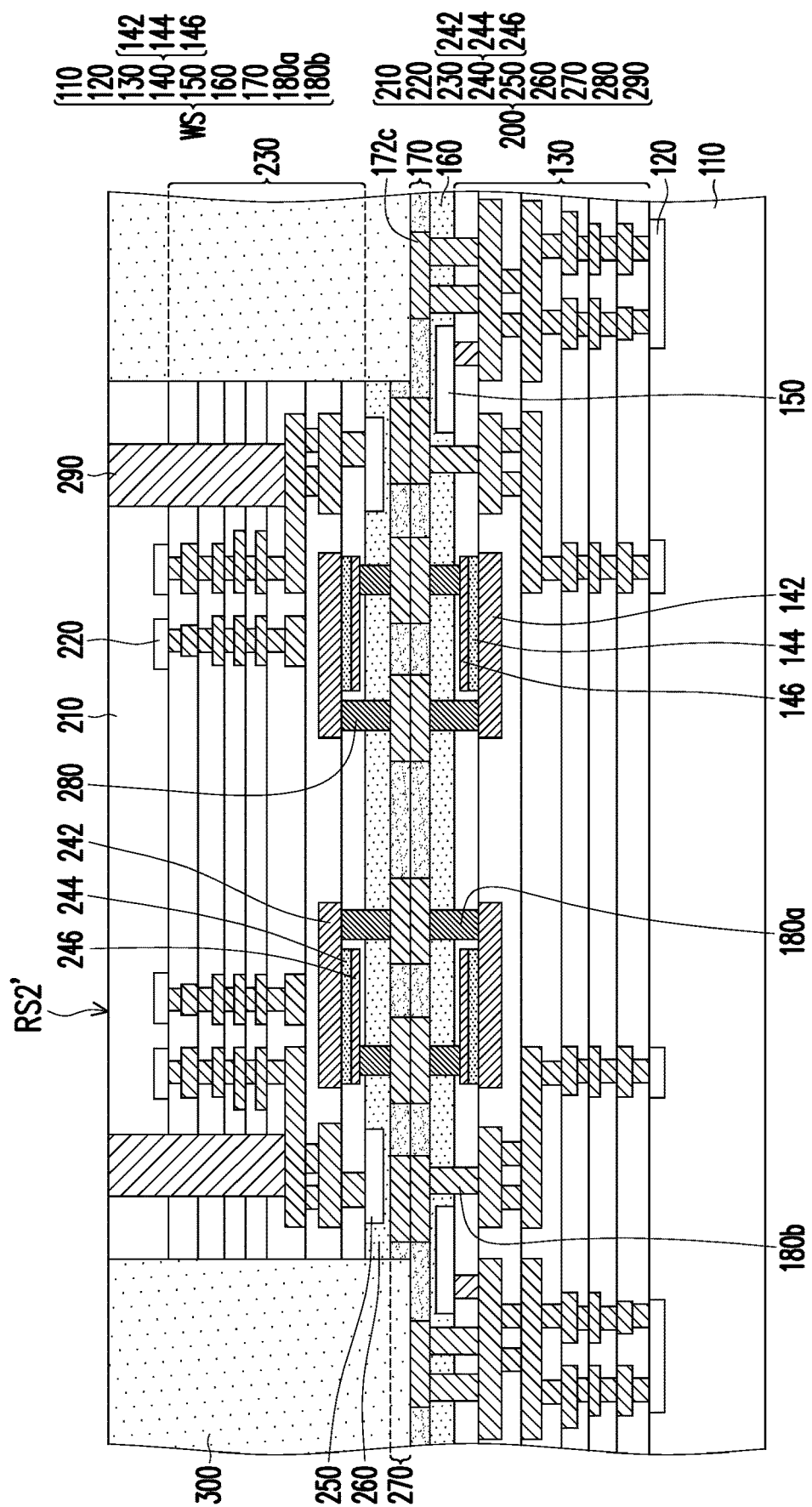

Referring to FIG. 1F and FIG. 1G, an encapsulant 300 is formed over the wafer substrate WS to laterally encapsulate the die 200. For example, the encapsulant 300 covers the bonding pads 172c of the bonding layer 170. That is, the encapsulant 300 is directly in contact with the bonding pads 172c of the bonding layer 170. In some embodiments, a material of the encapsulant 300 includes a molding compound, a polymeric material, such as polyimide, epoxy resin, acrylic resin, phenol resin, BCB, PBO, a combination thereof, or other suitable polymer-based dielectric materials. In some alternative embodiments, the encapsulant 300 may include silicon oxide and/or silicon nitride. In some embodiments, the encapsulant 300 further includes fillers. Alternatively, the encapsulant 300 may be free of fillers. In some embodiments, the encapsulant 300 may be formed by the following steps. First, an encapsulation material (not shown) is formed over the bonding layer 170 to encapsulate the die 200. At this stage, the semiconductor substrate 210 of the die 200 is not revealed and is well protected by the insulating material. For example, the rear surface RS2 of the die 200 is not revealed. In some embodiments, the encapsulation material may be formed by a molding process (such as a compression molding process), a spin-coating process, a CVD process, a PECVD process, an ALD process, or the like. After the encapsulation material is formed, the encapsulation material is thinned until the rear surface RS2 of the die 200 is exposed, so as to form the encapsulant 300 aside the die 200. In some embodiments, the encapsulation material may be thinned or planarized through a grinding process, such as a mechanical grinding process, a chemical mechanical polishing (CMP) process, or the like. In some embodiments, the encapsulant 300 may be referred to as "gap fill oxide."

After the encapsulant 300 is formed, the die 200 and the encapsulant 300 are further thinned until the TSVs 290 are exposed. That is, the die 200 is thinned from the rear surface RS2. In some embodiments, the die 200 and the encapsulant 300 may be thinned or planarized through a grinding process, such as a mechanical grinding process, a CMP process, or the like. In some embodiments, after the TSVs 290 are exposed, the die 200 and the encapsulant 300 may be further thinned to reduce the overall thickness of the die 200. After the thinning process, a rear surface RS2' of the die 200 is substantially coplanar with a top surface of the encapsulant 300. As illustrated in FIG. 1G, after the thinning process, the TSVs 290 penetrate through the semiconductor substrate 210 of the die 200.

Figure 1H:
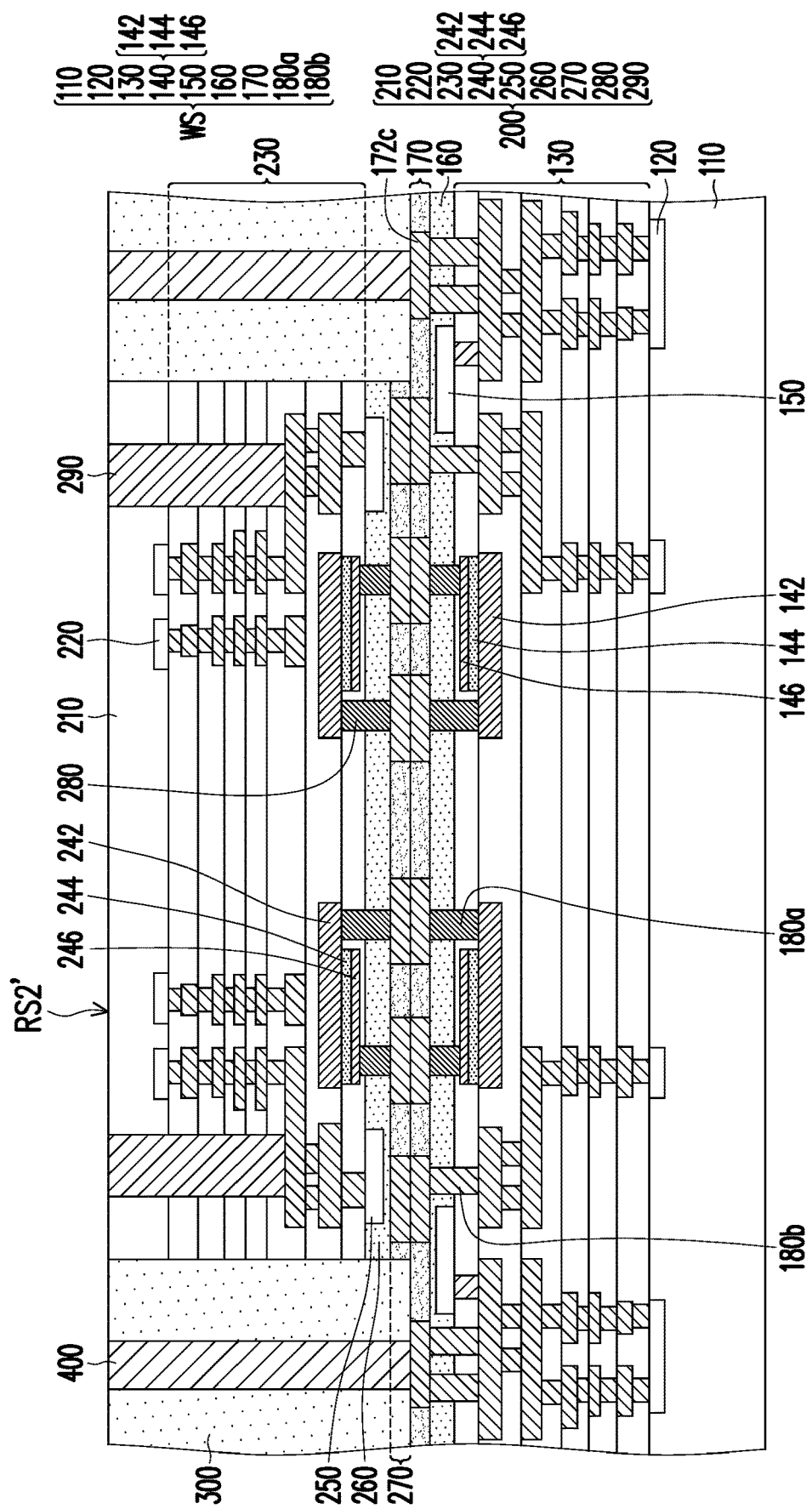

Referring to FIG. 1H, a plurality of through insulating vias (TIV) 400 is formed in the encapsulant 300. In some embodiments, the TIVs 400 are formed aside the die 200. In some embodiments, the TIVs 400 penetrate through the encapsulant 300 to be in direct contact with the bonding pads 172c of the bonding layer 170. In some embodiments, a material of the TIVs 400 includes aluminum, titanium, copper, nickel, tungsten, and/or alloys thereof. In some embodiments, the TIVs 400 may be formed by the following steps. First, a laser drilling or an etching process is performed on the encapsulant 300 to form a plurality of openings (not shown). The openings expose at least a portion of each of the bonding pads 172c. Thereafter, a plating process is performed to fill the openings, so as to form the TIVs 400.

Figure 1I:
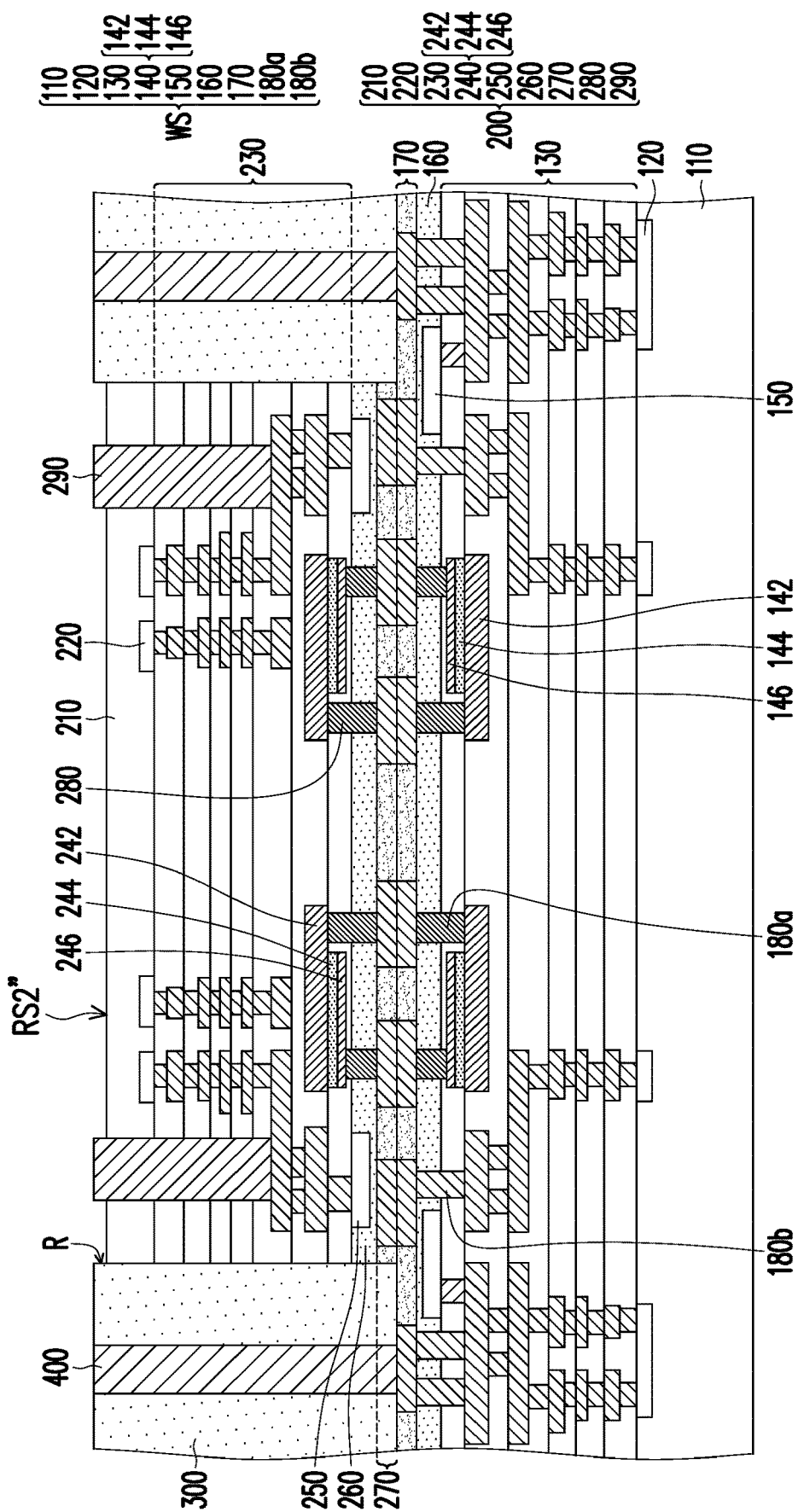

Referring to FIG. 1I, a portion of the die 200 is removed to form a recess R. For example, a portion of the semiconductor substrate 210 of the die 200 is removed to form the recess R. As illustrated in FIG. 1I, the TSVs 290 are partially located in the recess R. In some embodiments, at least a portion of each TSV 290 protrudes from the semiconductor substrate 210 of the die 200. That is, top surfaces of the TSVs 290 and the top surface of the encapsulant 300 are located at a level height higher than a rear surface RS2" of the die 200. In some embodiments, the semiconductor substrate 210 may be partially removed through an etching process. The etching process includes, for example, an isotropic etching process and/or an anisotropic etching process. For example, the semiconductor substrate 210 may be partially removed through a wet etching process, a drying etching process, or a combination thereof.

Figure 1J:
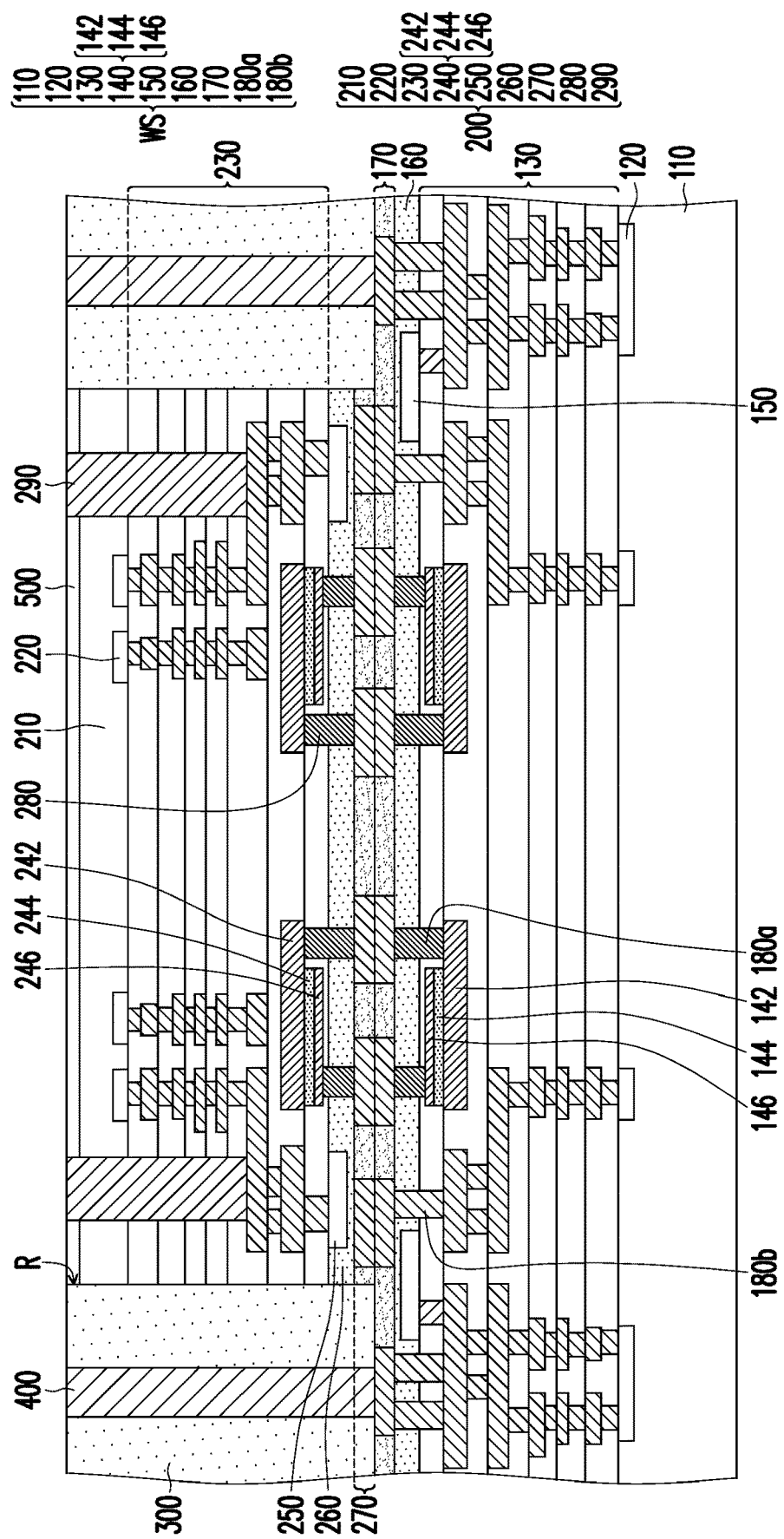

Referring to FIG. 1I and FIG. 1J, a protection layer 500 is formed to fill the recess R. In some embodiments, the protection layer 500 includes a molding compound, a molding underfill, or the like. Alternatively, the protection layer 500 may be made of a polymeric material, such as polyimide, epoxy resin, acrylic resin, phenol resin, BCB, PBO, or other suitable polymer-based dielectric materials. In some embodiments, the protection layer 500 may include fillers. Alternatively, the protection layer 500 may be free of fillers. As illustrated in FIG. 1J, the protruding portion of each TSV 290 is laterally encapsulated by the protection layer 500. In some embodiments, the protection layer 500 may be formed by the following steps. First, a protection material layer (not shown) is formed in the recess R and over the encapsulant 300. Subsequently, a grinding or thinning process is performed on the protection material layer until the TSVs 290 are revealed. The thinning process includes, for example, a mechanical grinding process, a CMP process, or the like. As illustrated in FIG. 1J, the encapsulant 300 laterally encapsulates the protection layer 500.

Figure 1K:
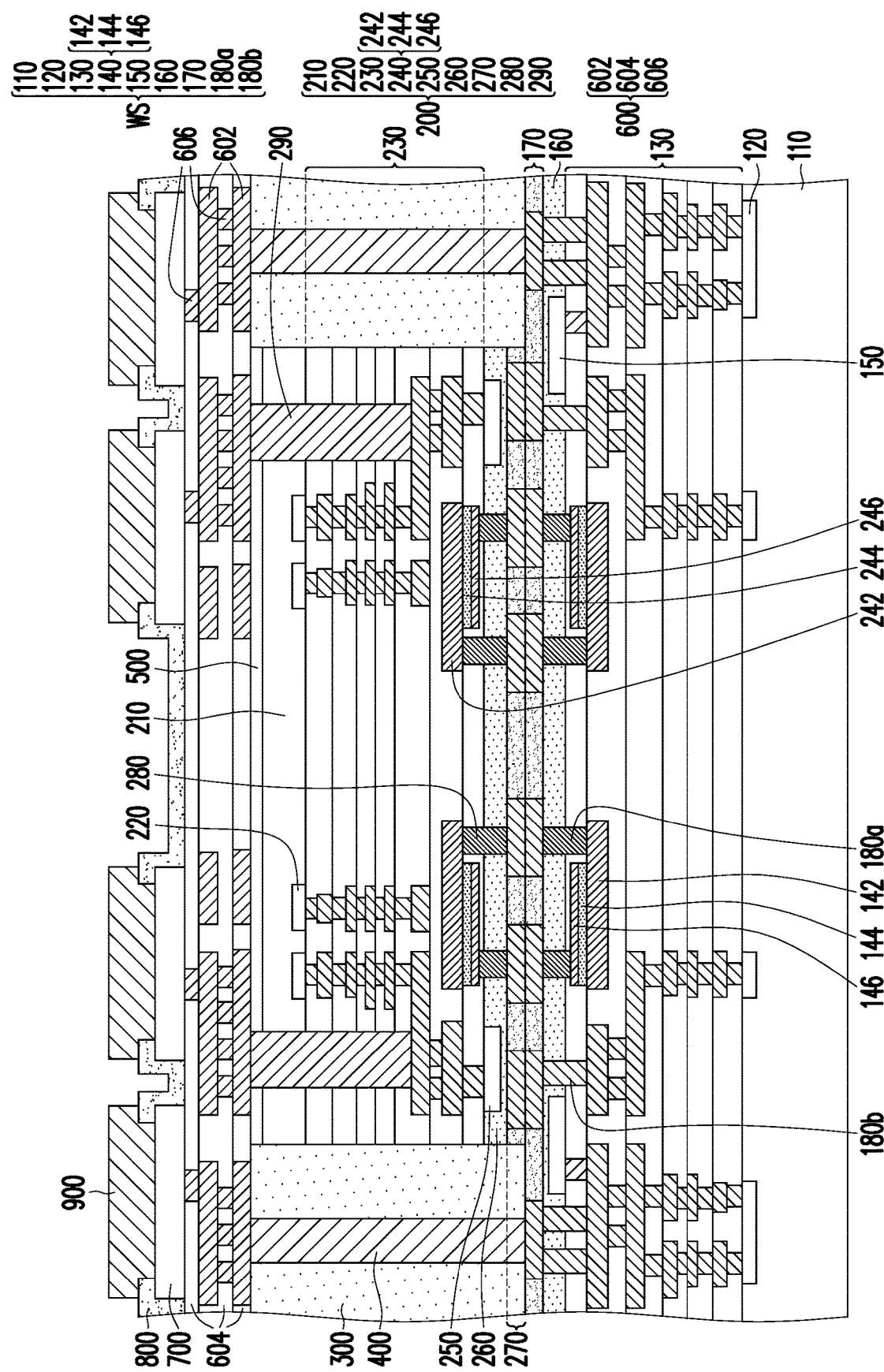

Referring to FIG. 1K, a redistribution structure 600 is formed over the die 200, the encapsulant 300, the TIVs 400, and the protection layer 500. In some embodiments, the redistribution structure 600 includes a plurality of conductive patterns 602, a plurality of dielectric layers 604, and a plurality of conductive vias 606. As illustrated in FIG. 1K, the conductive patterns 602 are embedded in the dielectric layers 604. In some embodiments, the conductive patterns 602 located at different level heights are connected to each other through the conductive vias 606. In other words, the conductive patterns 602 are electrically connected to each other through the conductive vias 606. In some embodiments, some of the bottommost conductive patterns 602 are directly in contact with the TSVs 290 of the die 200. In other words, the TSVs 290 electrically connects the interconnection structure 230 of the die 200 and the redistribution structure 600. In some embodiments, some of the bottommost conductive patterns 602 are directly in contact with the TIVs 400. In other words, the TIVs 400 electrically connect the wafer substrate WS and the redistribution structure 600.

In some embodiments, a material of the conductive patterns 602 and the conductive vias 606 includes aluminum, titanium, copper, nickel, tungsten, or alloys thereof. The conductive patterns 602 and the conductive vias 606 may be formed by, for example, electroplating, deposition, and/or photolithography and etching. In some embodiments, the conductive patterns 602 and the underlying conductive vias 606 may be formed simultaneously. In some embodiments, the material of the dielectric layers 604 includes polyimide, epoxy resin, acrylic resin, phenol resin, BCB, PBO, or any other suitable polymer-based dielectric material. The dielectric layers 604, for example, may be formed by suitable fabrication techniques such as spin-on coating, CVD, PECVD, or the like. It should be noted that the number of the conductive patterns 602, the number of the dielectric layers 604, and the number of the conductive vias 606 illustrated in FIG. 1K are merely for illustrative purposes, and the disclosure is not limited thereto. In some alternative embodiments, fewer or more layers of the conductive patterns 602, the dielectric layers 604, or the conductive vias 606 may be formed depending on the circuit design.

After the redistribution structure 600 is formed, a plurality of conductive pads 700 is formed over the redistribution structure 600. In some embodiments, a material of the conductive pads 700 includes aluminum, titanium, copper, nickel, tungsten, or alloys thereof. In some embodiments, the material of the conductive pads 700 is different from the material of the conductive patterns 602 of the redistribution structure 600. For example, the conductive patterns 602 of the redistribution structure 600 may be made of copper while the conductive pads 700 may be made of aluminum. However, the disclosure is not limited thereto. In some alternative embodiments, the material of the conductive pads 700 may be the same as the material of the conductive patterns 602 of the redistribution structure 600. In some embodiments, the conductive pads 700 may be formed by, for example, electroplating, deposition, and/or photolithography and etching. In some embodiments, the conductive pads 700 are directly in contact with the topmost conductive vias 606, thereby rendering electrical connection with the redistribution structure 600.

After the conductive pads 700 are formed, a passivation layer 800 is formed over the redistribution structure 600 and the conductive pads 700 to partially cover the conductive pads 700. In some embodiments, a material of the passivation layer 800 includes oxides, such as silicon oxide or the like. Alternatively, the passivation layer 800 may include polyimide, epoxy resin, acrylic resin, phenol resin, BCB, PBO, or any other suitable polymer-based dielectric material. The passivation layer 800, for example, may be formed by suitable fabrication techniques, such as spin-on coating, CVD, PECVD, or the like. In some embodiments, the passivation layer 800 is formed to expose at least a portion of each conductive pad 700.

As illustrated in FIG. 1K, a plurality of under-bump metallurgy (UBM) patterns 900 are formed over the conductive pads 700 and the passivation layer 800. In some embodiments, the UBM patterns 900 are in direct contact with the portion of the conductive pads 700 exposed by the passivation layer 800. That is, the UBM patterns 900 are electrically connected to the conductive pads 700 and the redistribution structure 600. In some embodiments, a material of the UBM patterns 900 includes aluminum, titanium, copper, nickel, tungsten, or alloys thereof. The UBM patterns 900 may be formed by, for example, electroplating, deposition, and/or photolithography and etching.

Figure 1L:
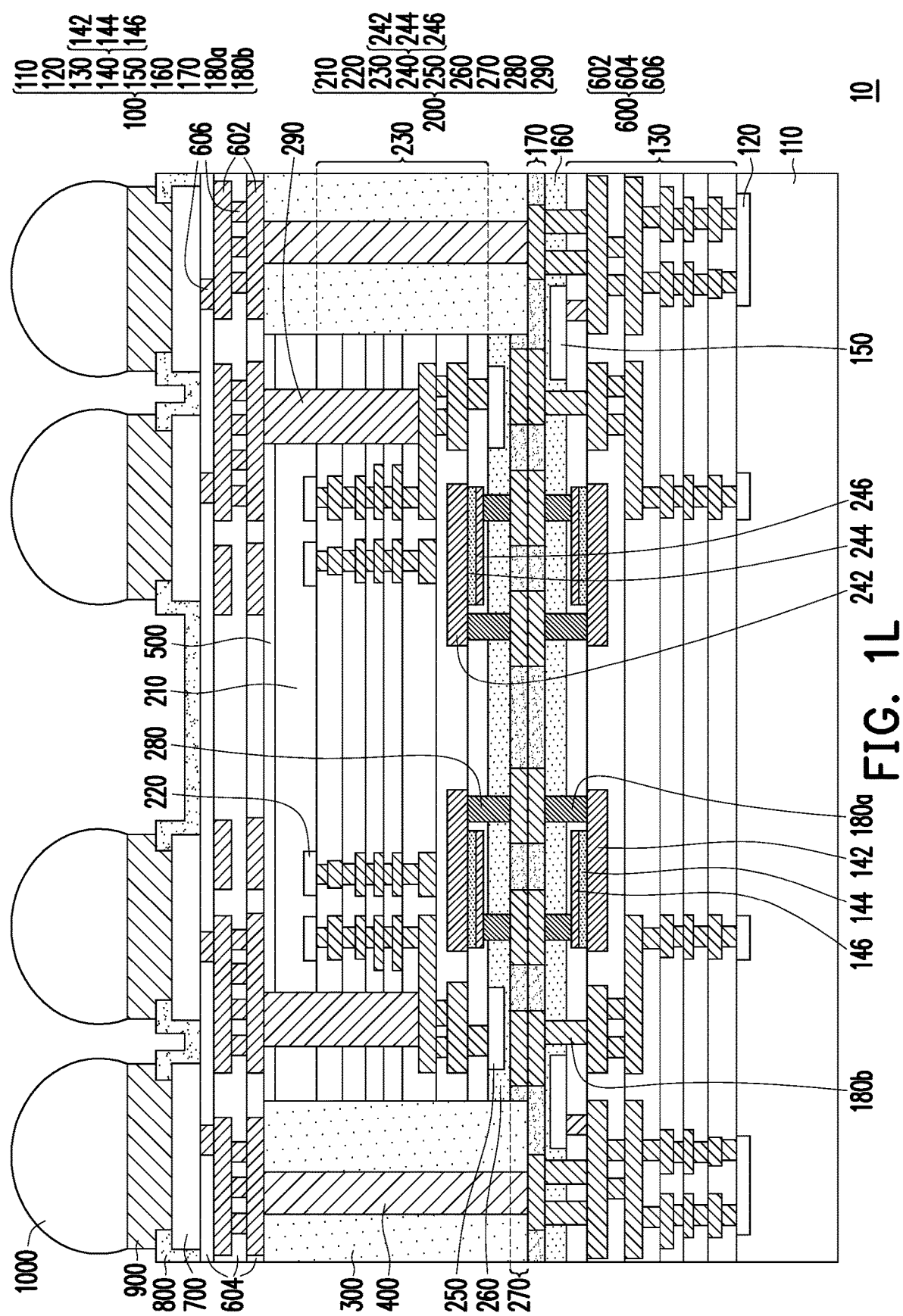

Referring to FIG. 1L, a plurality of conductive terminals 1000 is formed on the UBM patterns 900. In some embodiments, the conductive terminals 1000 are attached to the UBM patterns 900 through a solder flux. In some embodiments, the conductive terminals 1000 are, for example, solder balls, ball grid array (BGA) balls, or controlled collapse chip connection (C4) bumps. In some embodiments, the conductive terminals 1000 are made of a conductive material with low resistivity, such as Sn, Pb, Ag, Cu, Ni, Bi, or an alloy thereof.

After the conductive terminals 1000 are formed, a singulation process is performed to form a plurality of packages 10. In some embodiments, the dicing process or the singulation process typically involves dicing with a rotating blade or a laser beam. In other words, the dicing or singulation process is, for example, a laser cutting process, a mechanical cutting process, or other suitable processes. In some embodiments, during the singulation process, the wafer substrate WS is divided into a plurality of dies 100. That is, each die 100 includes the semiconductor substrate 110, the devices 120, the interconnection structure 130, the capacitors 140, the conductive pads 150, the passivation layer 160, the bonding layer 170, and the bonding vias 180a, 180b. As illustrated in FIG. 1L, the TIVs 400 electrically connect the die 100 and the redistribution structure 600. In some embodiments, the die 200 is stacked on and bonded to the die 100. In other words, multiple dies 100 and 200 are integrated into a single package 10. As such, the package 10 may be referred to as a "system on integrated circuit (SOIC) package."

In some embodiments, the die 100 may be capable of performing storage functions. For example, the die 100 may be Dynamic Random Access Memory (DRAM), Resistive Random Access Memory (RRAM), Static Random Access Memory (SRAM), or the like. However, the disclosure is not limited thereto. In some alternative embodiments, the die 100 may be Central Process Unit (CPU) dies, Graphic Process Unit (GPU) dies, Field-Programmable Gate Array (FPGA), or the like.

As illustrated in FIG. 1L, the capacitors 140 are embedded in the interconnection structure 130. In other words, the die 100 has capacitors 140 embedded therein. Similarly, the die 200 has capacitors 240 embedded therein. In some embodiments, the capacitor 140 and the capacitor 240 are overlapped with each other and are arranged in a stacked manner. As such, the area requirement for the individual capacitor 140 and the individual capacitor 240 may be sufficiently reduced to render desired effective capacitance. Therefore, the package 10 may be miniaturized, and more components may be integrated into a given area.

Figure 3C:
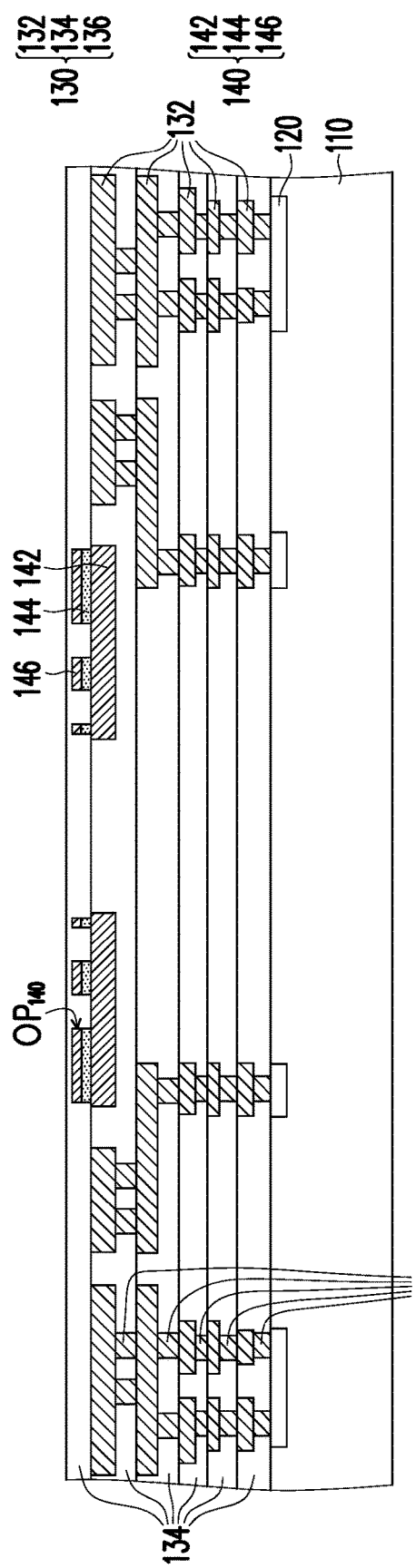

FIG. 3A to FIG. 3L are schematic cross-sectional views illustrating a manufacturing process of a package 20 in accordance with some alternative embodiments of the disclosure. Referring to FIG. 3A to FIG. 3B, the steps in FIG. 3A to FIG. 3B are similar to the steps shown in FIG. 1A to FIG. 1B except each insulating layer 144 in FIG. 3B covers more area of the corresponding metal layer 142, so the detailed descriptions thereof are omitted herein. That is, each insulating layer 144 in FIG. 3B is larger than each insulating layer 144 in FIG. 1B.

Referring to FIG. 3C, a plurality of metal layers 146 is formed on the insulating layers 144. In some embodiments, the metal layers 146 in FIG. 3C may be similar to the metal layers 146 in FIG. 1C, so the detailed descriptions thereof are omitted herein. In some embodiments, the metal layers 142, the insulating layers 144, and the metal layers 146 are stacked in sequential order to form "MIM structures." That is, in some embodiments, the metal layer 142, the insulating layer 144, and the metal layer 146 are collectively referred to as a capacitor 140. In some embodiments, the metal layer 142 may serve as a bottom electrode of the capacitor 140 while the metal layer 146 may serve as a top electrode of the capacitor 140.

After the formation of the capacitors 140, an etching process is performed on the capacitors 140 to form a plurality of openings $OP_{140}$. For example, a portion of the metal layer 146 and a portion of the insulating layer 144 are removed to form the openings $OP_{140}$. In some embodiments, the openings $OP_{140}$ penetrate through the meal layer 146 and the insulating layer 144, so as to expose at least a portion of each metal layer 142. Thereafter, a dielectric layer 134 (the topmost dielectric layer 134 shown in FIG. 3C) is formed over the conductive patterns 132 to cover the capacitors 140. In some embodiments, the dielectric layer 134 fills the openings $OP_{140}$ of the capacitors 140. It should be noted that said dielectric layer 134 may be considered as part of the interconnection structure 130. In other words, the capacitors 140 are embedded in the interconnection structure 130.

Figure 3D:
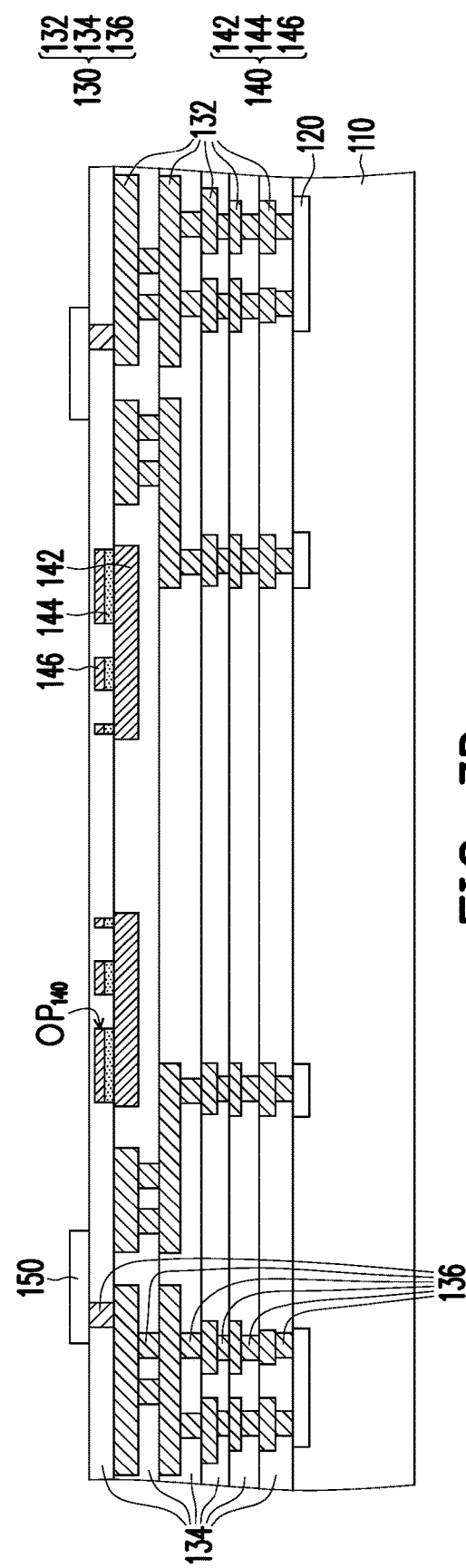
Figure 3E:
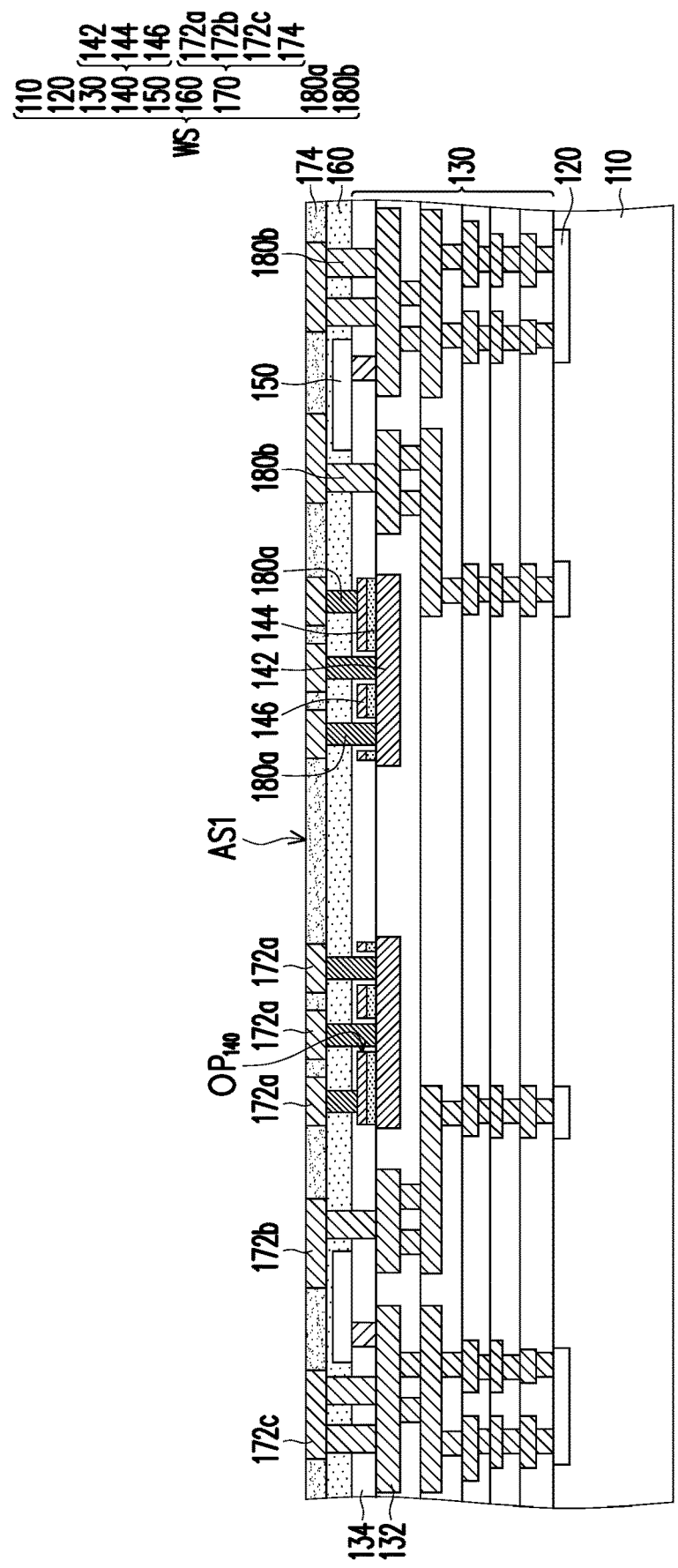

Referring to FIG. 3D to FIG. 3E, the steps in FIG. 3D to FIG. 3E are similar to the steps shown in FIG. 1D to FIG. 1E, so similar elements are denoted by similar reference numerals, and the detailed descriptions thereof are omitted herein. The relative configuration of the bonding pads 172a with respect to the capacitors 140 will be described below in conjunction with FIG. 4.

Figure 4:
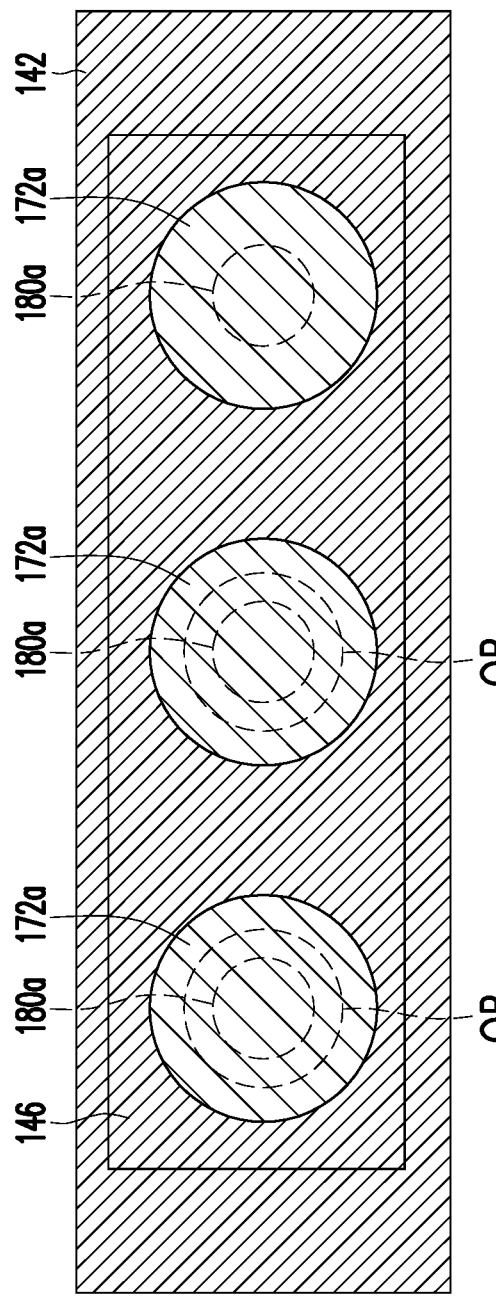
FIG. 4 is a partial top view of FIG. 3E.

FIG. 4 is a partial top view of FIG. 3E. As illustrated in FIG. 3E and FIG. 4, the bonding pads 172a are located directly above the capacitors 140. In some embodiments, the bonding pads 172a are located directly above both of the metal layer 146 and the metal layer 142. In some embodiments, the bonding vias 180a are formed to penetrate through the passivation layer 160 and at least part of the topmost dielectric layer 134 of the interconnection structure 130 to establish electrical connection with the capacitors 140. For example, one of the bonding vias 180a is directly in contact with the metal layer 146. That is, one of the bonding vias 180a penetrates through the passivation layer 160 and at least part of the topmost dielectric layer 134 of the interconnection structure 130 to establish electrical connection between one of the bonding pads 172a and the metal layer 146 of the capacitor 140. On the other hand, the rest of the bonding vias 180a extend into the openings $OP_{140}$ of the capacitor 140 to be in direct contact with the metal layer 142. That is, the rest of of the bonding vias 180a penetrate through the passivation layer 160 and at least part of the topmost dielectric layer 134 of the interconnection structure 130 and extends into the openings $OP_{140}$ of the capacitor 140 to establish electrical connection between the rest of the bonding pads 172a and the metal layer 142 of the capacitor 140.

In some embodiments, by forming the openings $OP_{140}$ in the capacitors 140, the connection between the metal layer 142 and other elements may be ensured while increasing the overlapping area between the metal layer 142, the insulating layer 144, and the metal layer 146. As such, the capacitance of the capacitors 140 may be sufficiently increased.

Figure 3F:
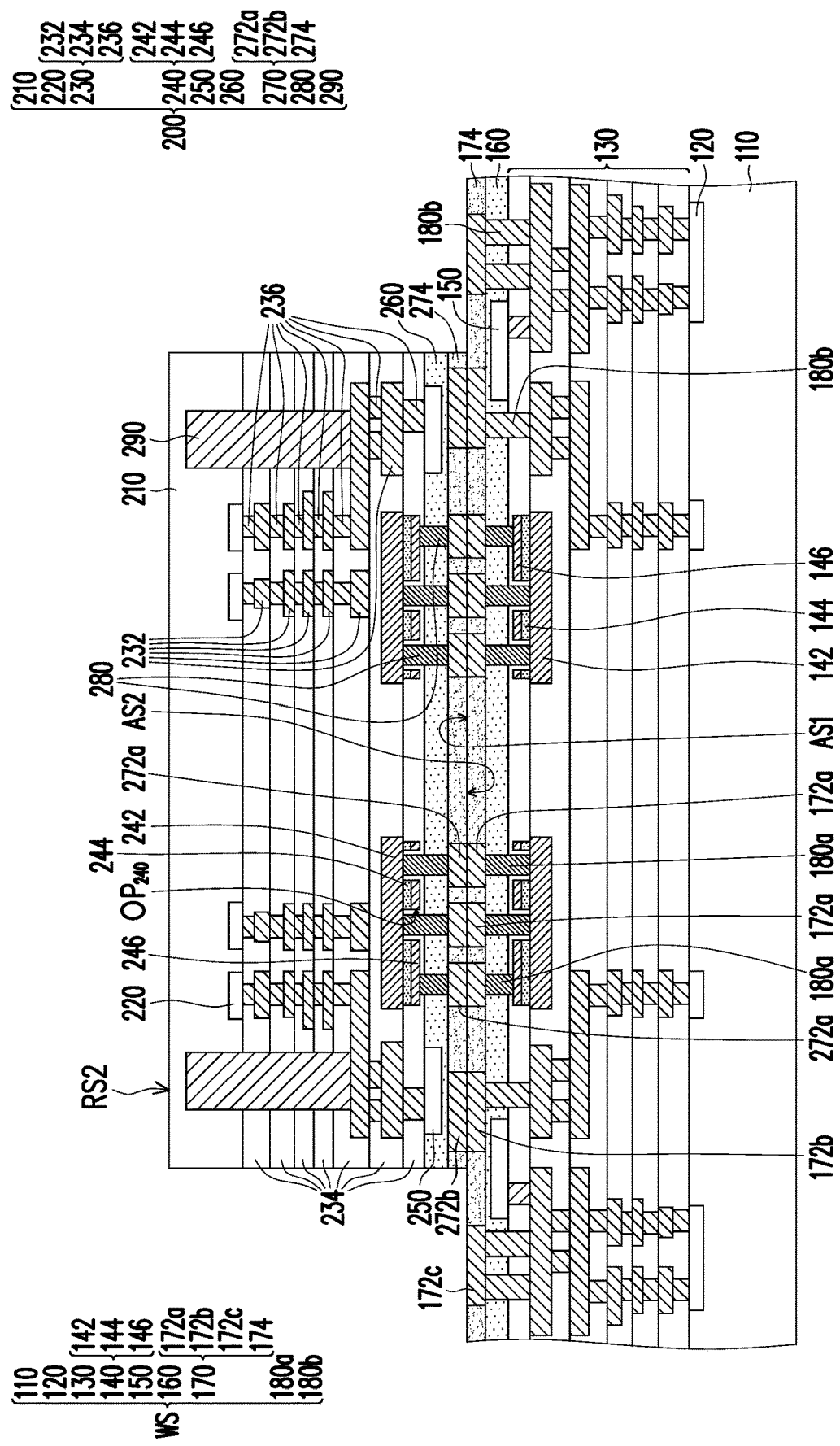
Figure 3G:
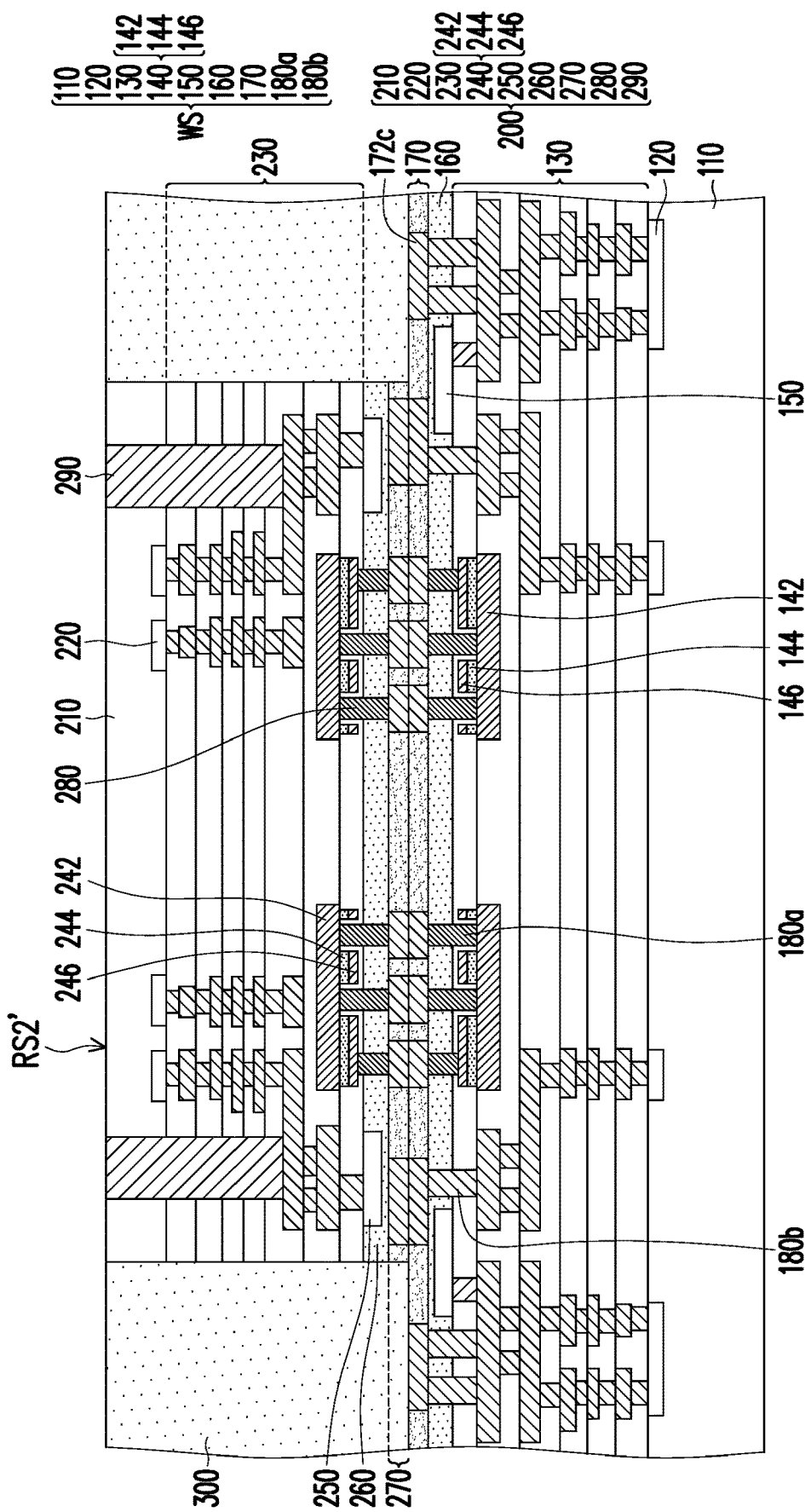
Figure 3H:
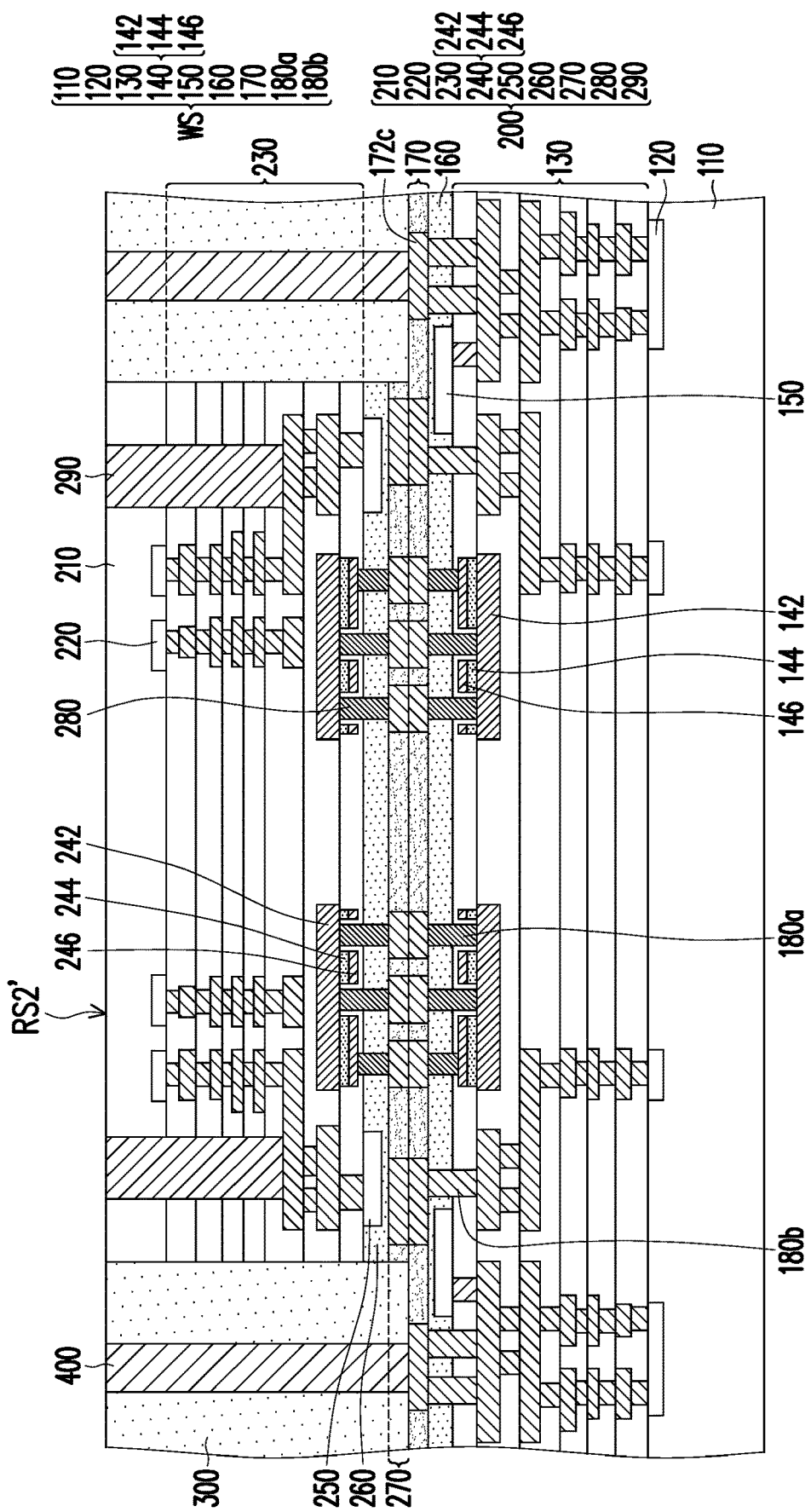
Figure 3I:
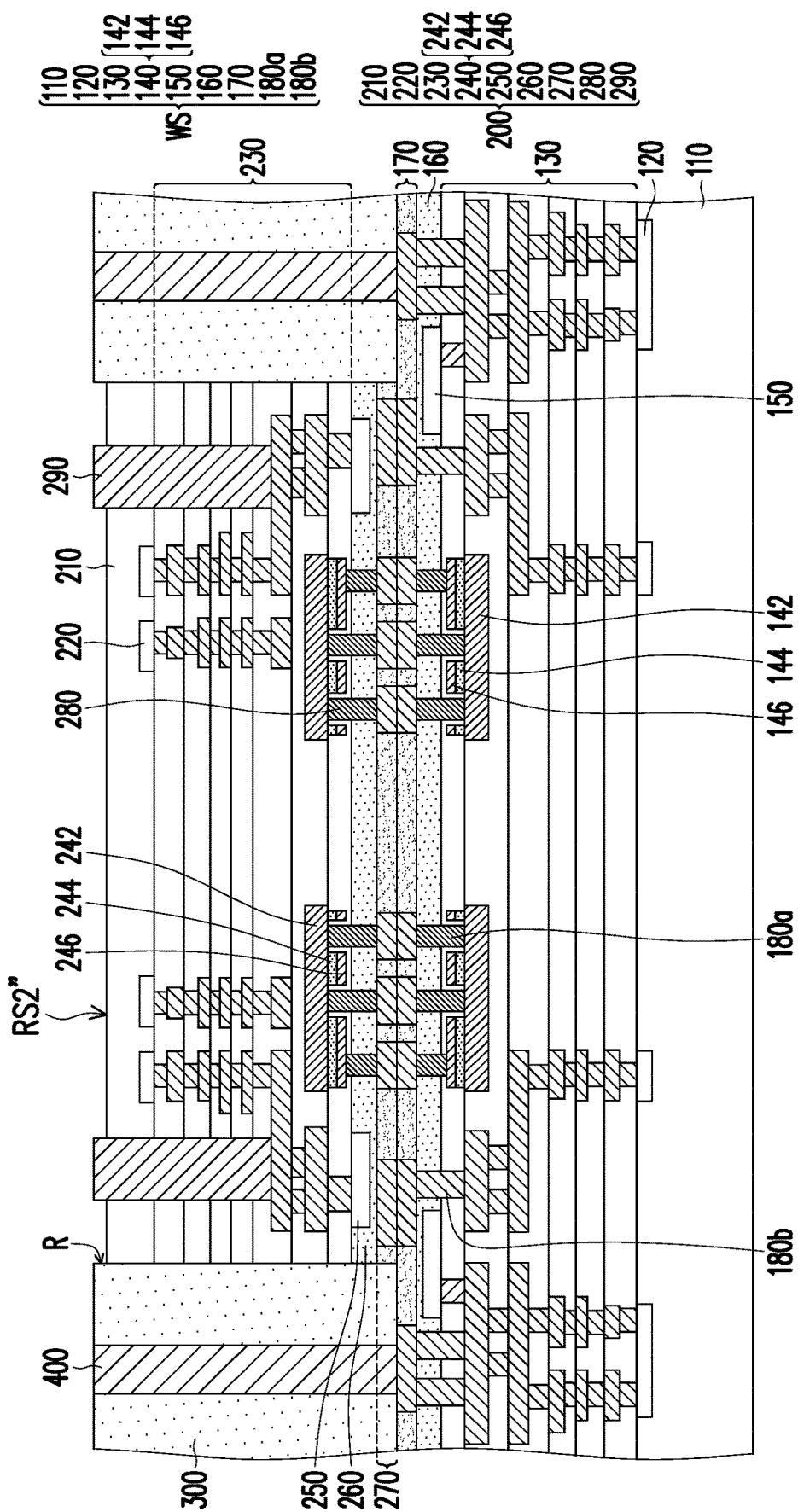
Figure 3J:
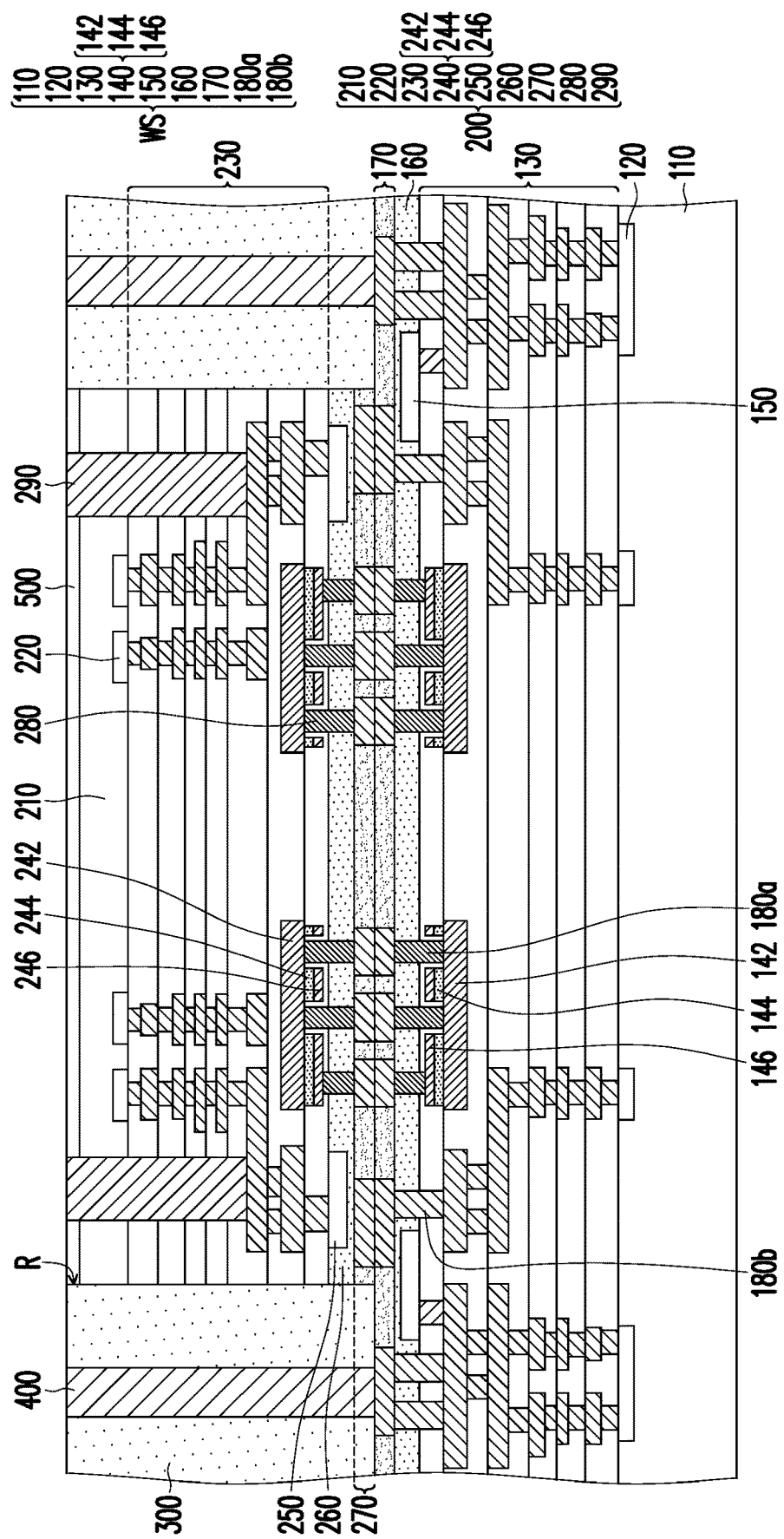
Figure 3K:
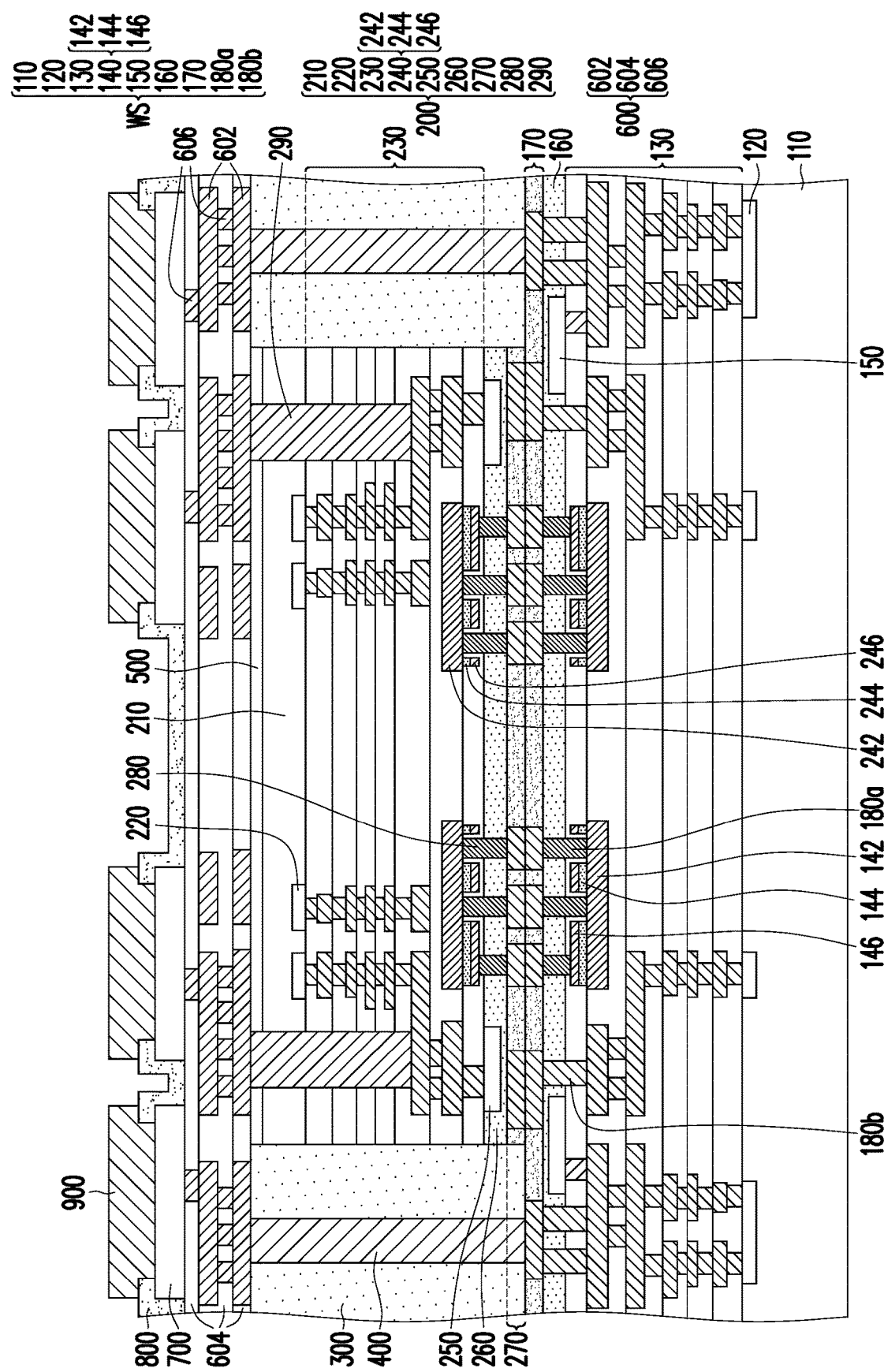
Figure 3L:
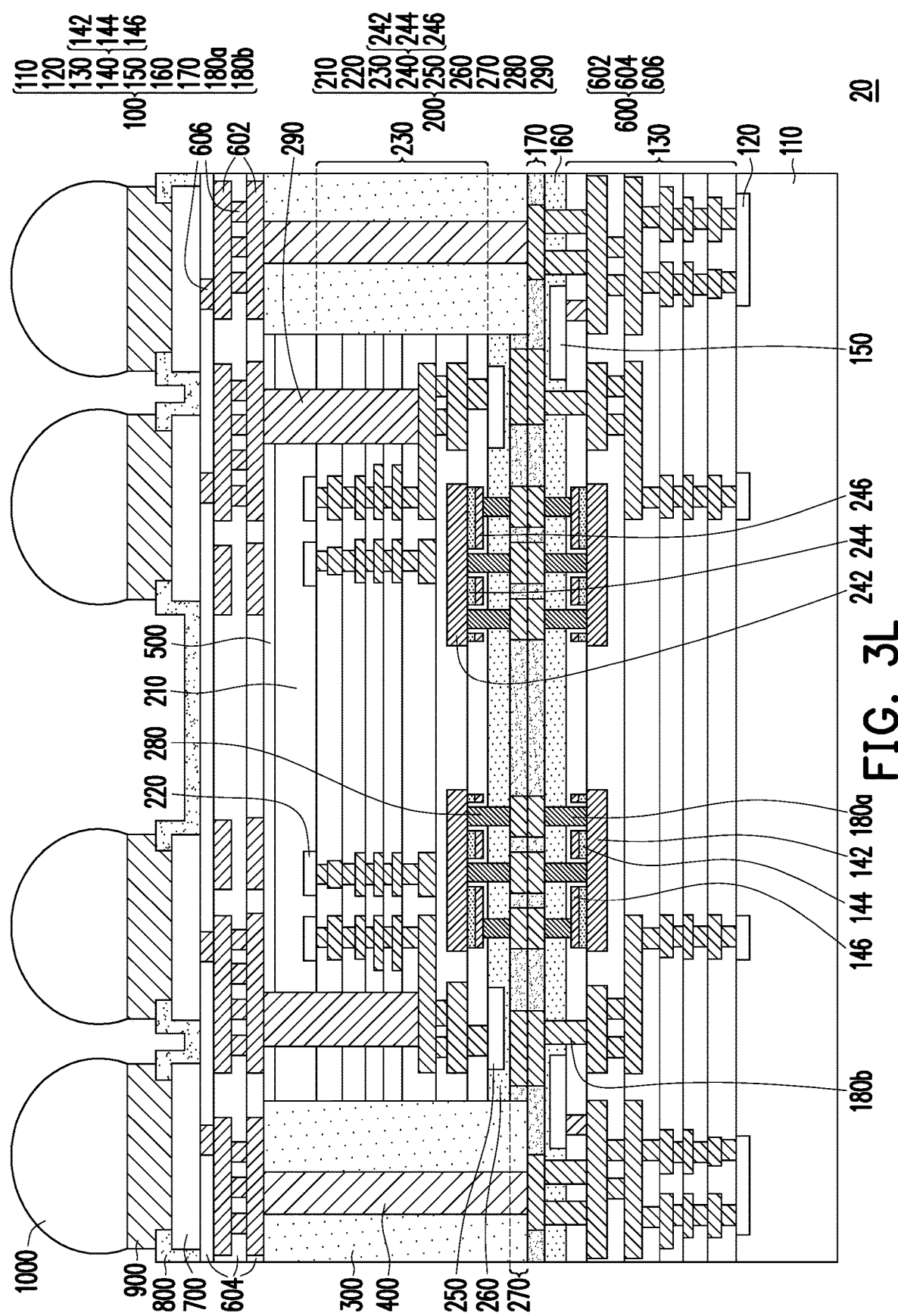

Referring to FIG. 3F, the step in FIG. 3F is similar to the step shown in FIG. 1F, so similar elements are denoted by similar reference numerals, and the detailed descriptions thereof are omitted herein. Similar to the capacitors 140, the capacitors 240 illustrated in FIG. 3F also have openings $OP_{240}$ exposing the metal layer 242. In some embodiments, some of the bonding vias 280 extend into the openings $OP_{240}$ of the capacitors 240 to contact the metal layer 242.

Referring to FIG. 3G to FIG. 3L, the steps in FIG. 3G to FIG. 3L are similar to the steps shown in FIG. 1G to FIG. 1L, so similar elements are denoted by similar reference numerals, and the detailed descriptions thereof are omitted herein. In some embodiments, the die 200 is stacked on and bonded to the die 100. In other words, multiple dies 100 and 200 are integrated into a single package 20. As such, the package 20 may be referred to as a "SOIC package." In some embodiments, the capacitors 140 are embedded in the interconnection structure 130. In other words, the die 100 has capacitors 140 embedded therein. Similarly, the die 200 has capacitors 240 embedded therein. In some embodiments, the capacitor 140 and the capacitor 240 are overlapped with each other and are arranged in a stacked manner. As such, the area requirement for the individual capacitor 140 and the individual capacitor 240 may be sufficiently reduced to render desired effective capacitance. Therefore, the package 20 may be miniaturized, and more components may be integrated into a given area.

Figure 5C:
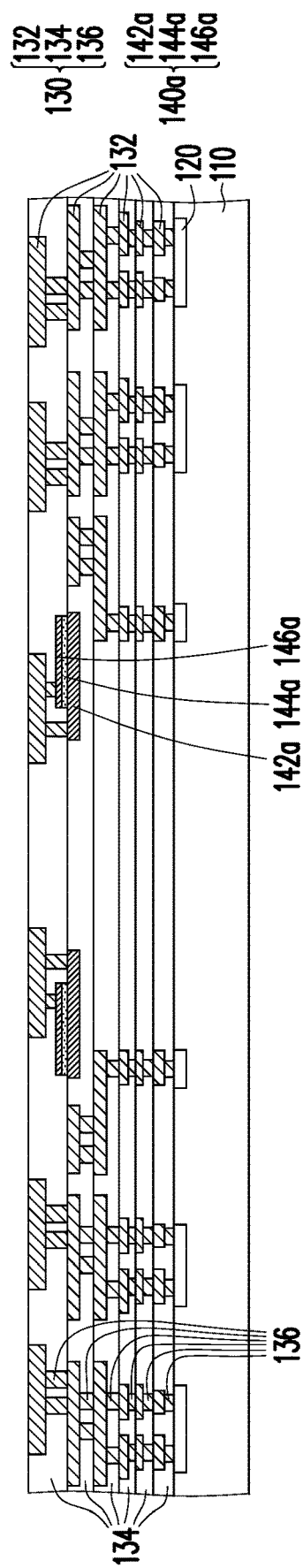

FIG. 5A to FIG. 5M are schematic cross-sectional views illustrating a manufacturing process of a package 30 in accordance with some alternative embodiments of the disclosure. Referring to FIG. 5A to FIG. 5B, the steps in FIG. 5A to FIG. 5B are similar to the steps shown in FIG. 1A to FIG. 1C, so similar elements are denoted by similar reference numeral, and the detailed descriptions thereof are omitted herein the detailed description thereof are omitted herein. In some embodiments, the capacitors 140a in FIG. 5B are similar to the capacitors 140 in FIG. 1C. That is, the metal layers 142a, the insulating layers 144a, and the metal layers 146a of the capacitors 140a in FIG. 5B are respectively similar to the metal layers 142, the insulating layer 144, and the metal layers 146 of the capacitors 140 in FIG. 1C.

Referring to FIG. 5C, after the capacitors 140a are formed, a plurality of conductive patterns 132 (the topmost conductive patterns 132 shown in FIG. 5C), a dielectric layer 134 (the topmost dielectric layer 134 shown in FIG. 5C), and a plurality of conductive vias 136 (the topmost conductive vias 136 shown in FIG. 5C) are formed over the capacitors 140a. It should be noted that said conductive patterns 132, said dielectric layer 134, and said conductive vias 136 may be considered as part of the interconnection structure 130. In other words, the capacitors 140a are embedded in the interconnection structure 130. In some embodiments, the topmost conductive patterns 132 are electrically connected to the capacitors 140a through the topmost conductive vias 136. For example, one of the conductive vias 136 is directly in contact with the metal layer 146a, and another one of the conductive vias 136 is directly in contact with the metal layer 142a.

Figure 5D:
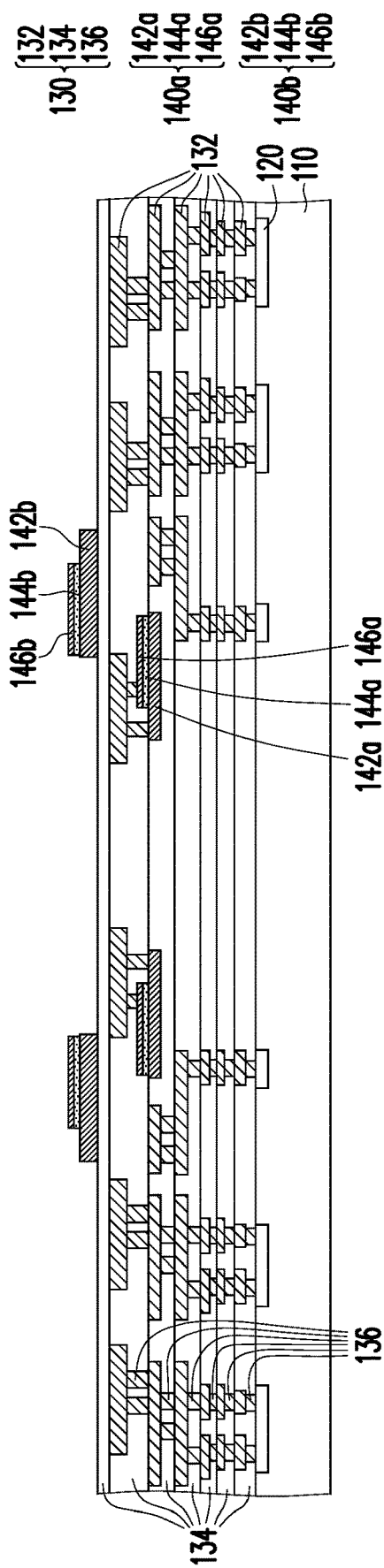

Referring to FIG. 5C and FIG. 5D, a dielectric layer 134 (the topmost dielectric layer 132 shown in FIG. 5D) is formed on the structure illustrated in FIG. 5C. It should be noted that said dielectric layer 134 may be considered as part of the interconnection structure 130. At this stage, the formation of the interconnection structure 130 is completed. After forming the interconnection structure 130, a plurality of capacitors 140b is formed over the interconnection structure 130. In some embodiments, the capacitors 140b in FIG. 5D are similar to the capacitors 140 in FIG. 1C, so the detailed descriptions thereof are omitted herein. In some embodiments, each capacitor 140b includes a metal layer 142b, an insulating layer 144b, and a metal layer 146b stacked in sequential order. The metal layer 142b, the insulating layer 144b, and the metal layer 146b in FIG. 5D are respectively similar to the metal layer 142, the insulating layer 144, and the metal layer 146 in FIG. 1C, so the detailed descriptions thereof are omitted herein. In some embodiments, the capacitors 140b are electrically connected to the capacitors 140a. However, the disclosure is not limited thereto. In some alternative embodiments, the capacitors 140b are electrically isolated from the capacitors 140a.

Figure 5E:
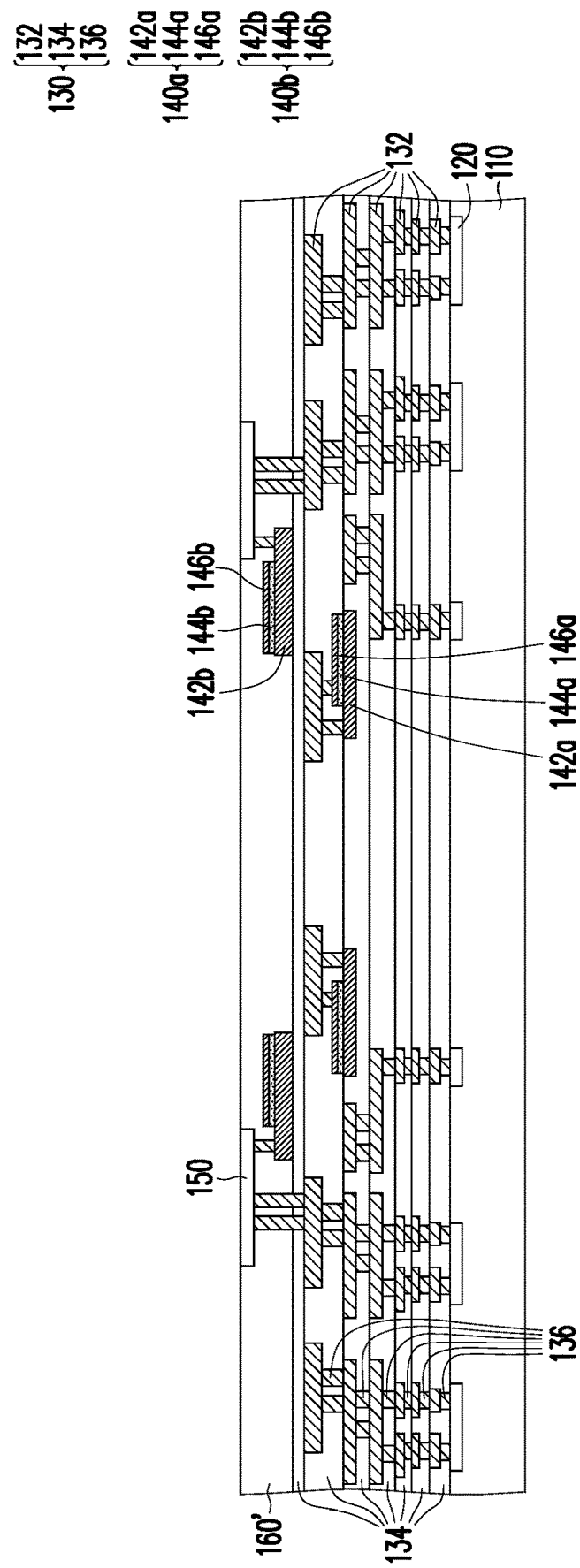

Referring to FIG. 5E, a passivation layer 160' and a plurality of conductive pads 150 are formed over the interconnection structure 130 and the capacitors 140b. In some embodiments, a material of the passivation layer 160' includes oxides, such as silicon oxide or the like. Alternatively, the passivation layer 160' may include polyimide, epoxy resin, acrylic resin, phenol resin, BCB, PBO, or any other suitable polymer-based dielectric material. The passivation layer 160', for example, may be formed by suitable fabrication techniques, such as spin-on coating, CVD, PECVD, or the like. In some embodiments, the conductive pads 150 are embedded in the passivation layer 160'. In some embodiments, the conductive pads 150 are electrically connected to the metal layer 142b of the capacitor 140b and the topmost conductive patterns 132 of the interconnection structure 130 through a plurality of conductive vias embedded in the passivation layer 160'. In some embodiments, the conductive pads 150 in FIG. 5E are similar to the conductive pads 150 in FIG. 1D, so the detailed descriptions thereof are omitted herein.

Figure 5F:
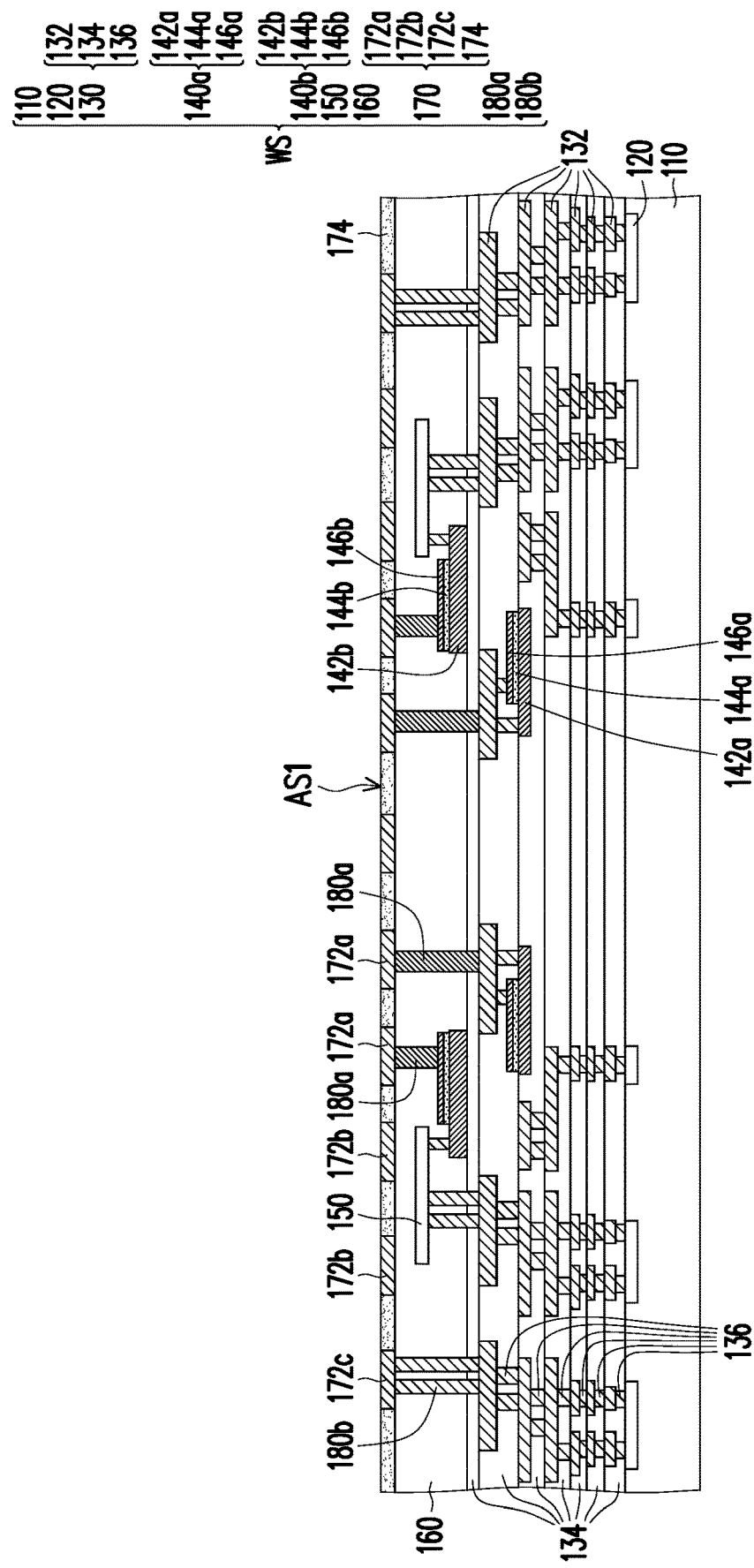

Referring to FIG. 5E and FIG. 5F, a dielectric layer is disposed on the passivation layer 160' and the conductive pads 150 to further protect the conductive pads 150. In some embodiments, the material and the formation method of the dielectric layer disposed may be the same as the passivation layer 160', so the detailed descriptions thereof is omitted herein. In some embodiments, the passivation layer 160' and the dielectric layer disposed may be collectively referred to as a passivation layer 160. The passivation layer 160 is formed over the interconnection structure 130, the capacitors 140b, and the conductive pads 150. As illustrated in FIG. 5F, the capacitors 140b and the conductive pads 150 are embedded in the passivation layer 160. In other words, the capacitors 140b and the capacitors 140a are located at different level heights.

After the passivation layer 160 is formed, a plurality of bonding vias 180a, 180b and a bonding layer 170 are formed to obtain a wafer substrate WS. As illustrated in FIG. 5F, some of the bonding vias 180a are formed to penetrate through the passivation layer 160 to establish electrical connection with the capacitors 140b. On the other hand, the rest of the bonding vias 180a are formed to penetrate through the passivation layer 160 and the topmost dielectric layer 134 of the interconnection structure 130 to establish electrical connection with the capacitors 140a. In some embodiments, the bonding vias 180b are formed to penetrate through the passivation layer 160 and the topmost dielectric layer 134 of the interconnection structure 130 to establish electrical connection with the conductive patterns 132 of the interconnection structures 130.

In some embodiments, the bonding layer 170 is formed over the passivation layer 160 and the bonding vias 180a, 180b. In other words, the passivation layer 160 is sandwiched between the interconnection structure 130 and the bonding layer 170. In some embodiments, the bonding layer 170 includes a plurality of bonding pads 172a, a plurality of bonding pads 172b, a plurality of bonding pads 172c, and a dielectric layer 174. In some embodiments, the bonding pads 172a, the bonding pads 172b, the bonding pads 172c, and the dielectric layer 174 in FIG. 5F are respectively similar to the bonding pads 172a, the bonding pads 172b, the bonding pads 172c, and the dielectric layer 174 in FIG. 1E, so the detailed descriptions thereof are omitted herein. In some embodiments, the bonding layer 170 may further include a plurality of dummy bonding pads (not shown). In some embodiments, the dummy bonding pads may be electrically floating and may serve the purpose of maintaining metal distribution to control warpage.

In some embodiments, top surfaces of the boning pads 172a, top surfaces of the bonding pads 172b, top surfaces of the bonding pads 172c, and a top surface of the dielectric layer 174 may be collectively referred to as an active surface AS1 of the wafer substrate WS. As shown in FIG. 5F, the top surfaces of the boning pads 172a, the top surfaces of the bonding pads 172b, the top surfaces of the bonding pads 172c, and the top surface of the dielectric layer 174 are substantially located at the same level height to provide an appropriate active surface AS1 for hybrid bonding.

Although not illustrated, in some embodiments, some of the bonding vias 180b may be disposed directly above the conductive pads 150 to establish electrical connection between the conductive pads 150 and other elements (for example, the bonding pads 172b directly above the conductive pads 150). That is, in some embodiments, some of the conductive pads 150 are electrically floating while some of the conductive pads 150 are able to transmit signal.

Figure 5G:
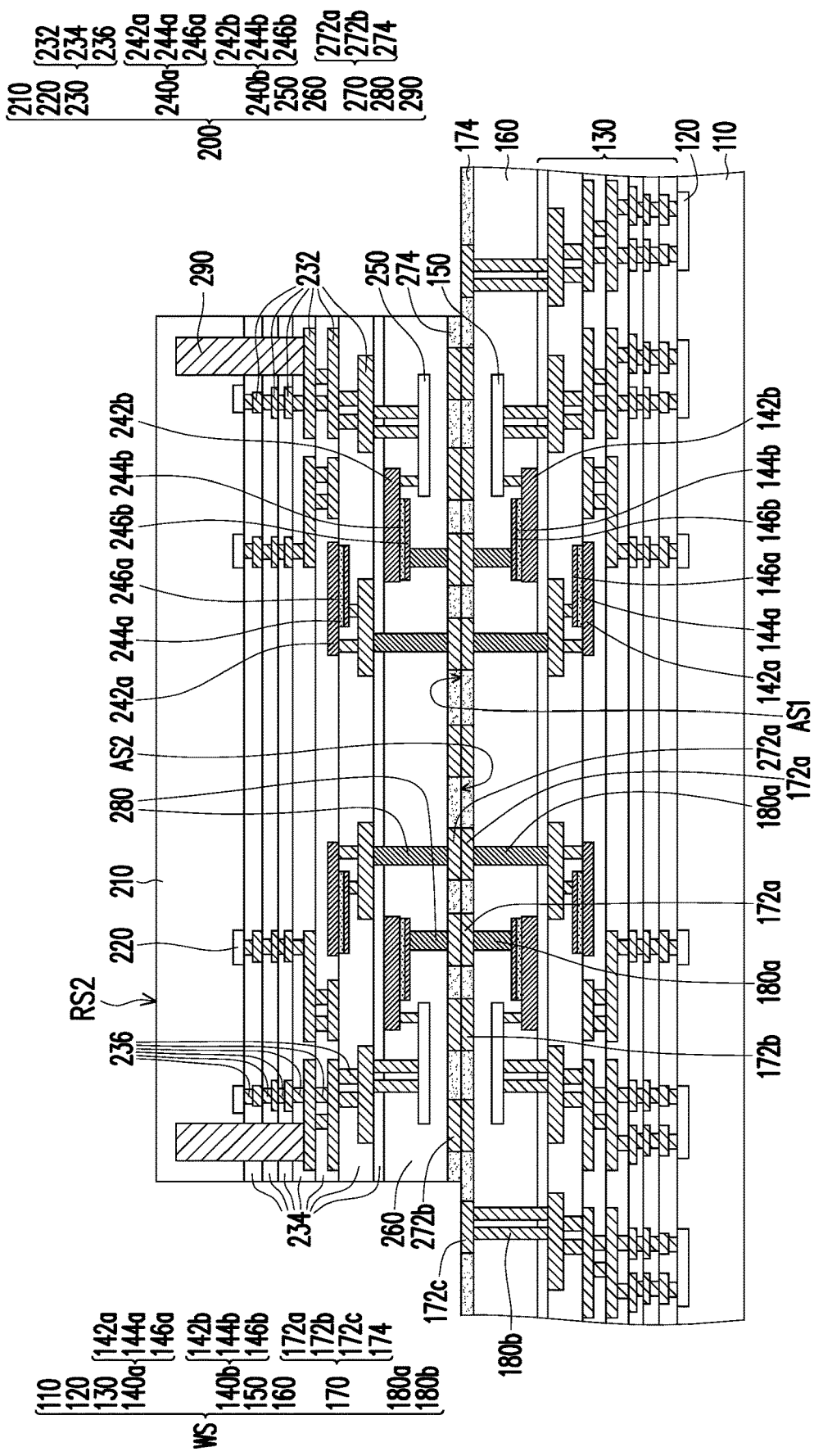
Figure 5H:
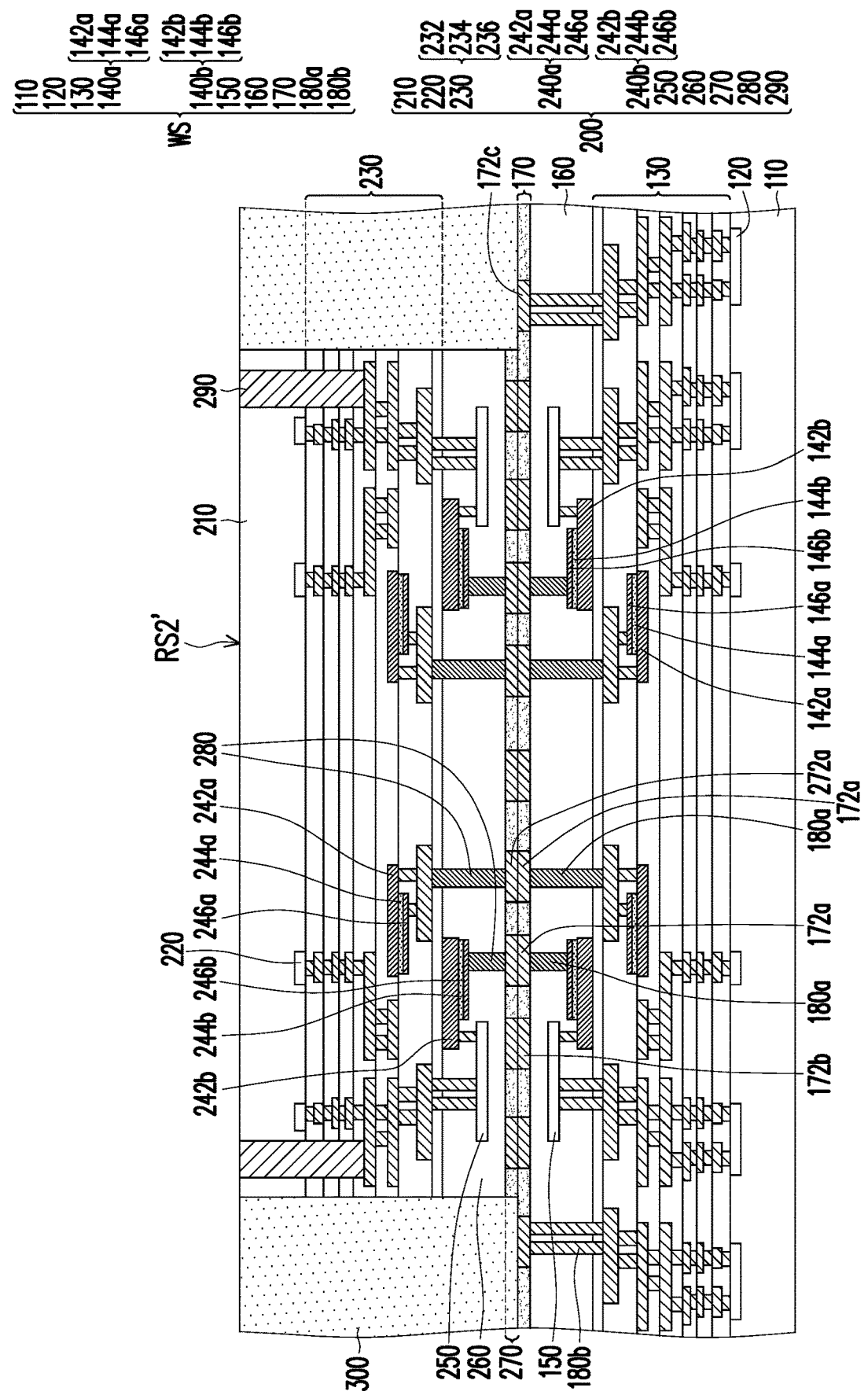
Figure 5I:
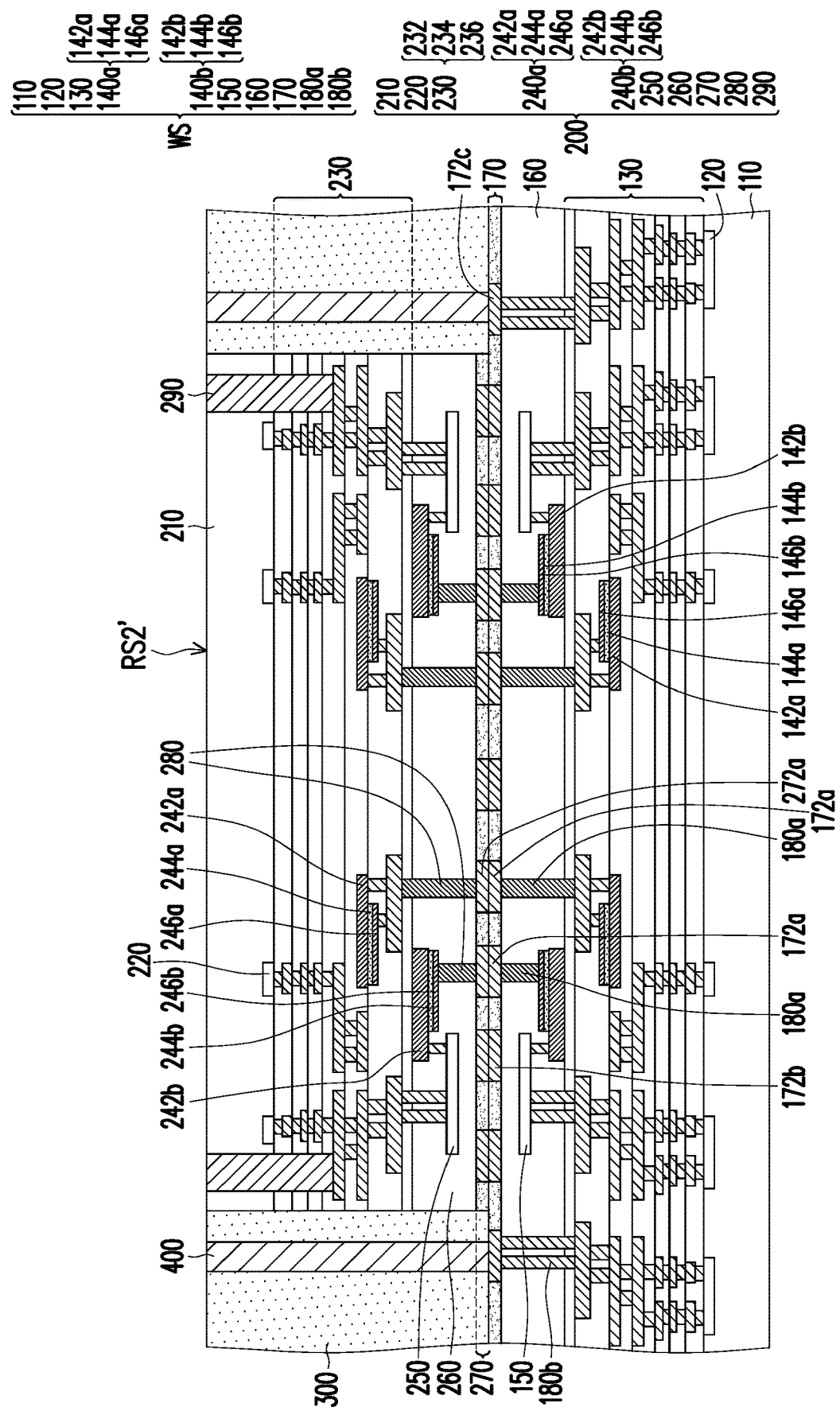
Figure 5J:
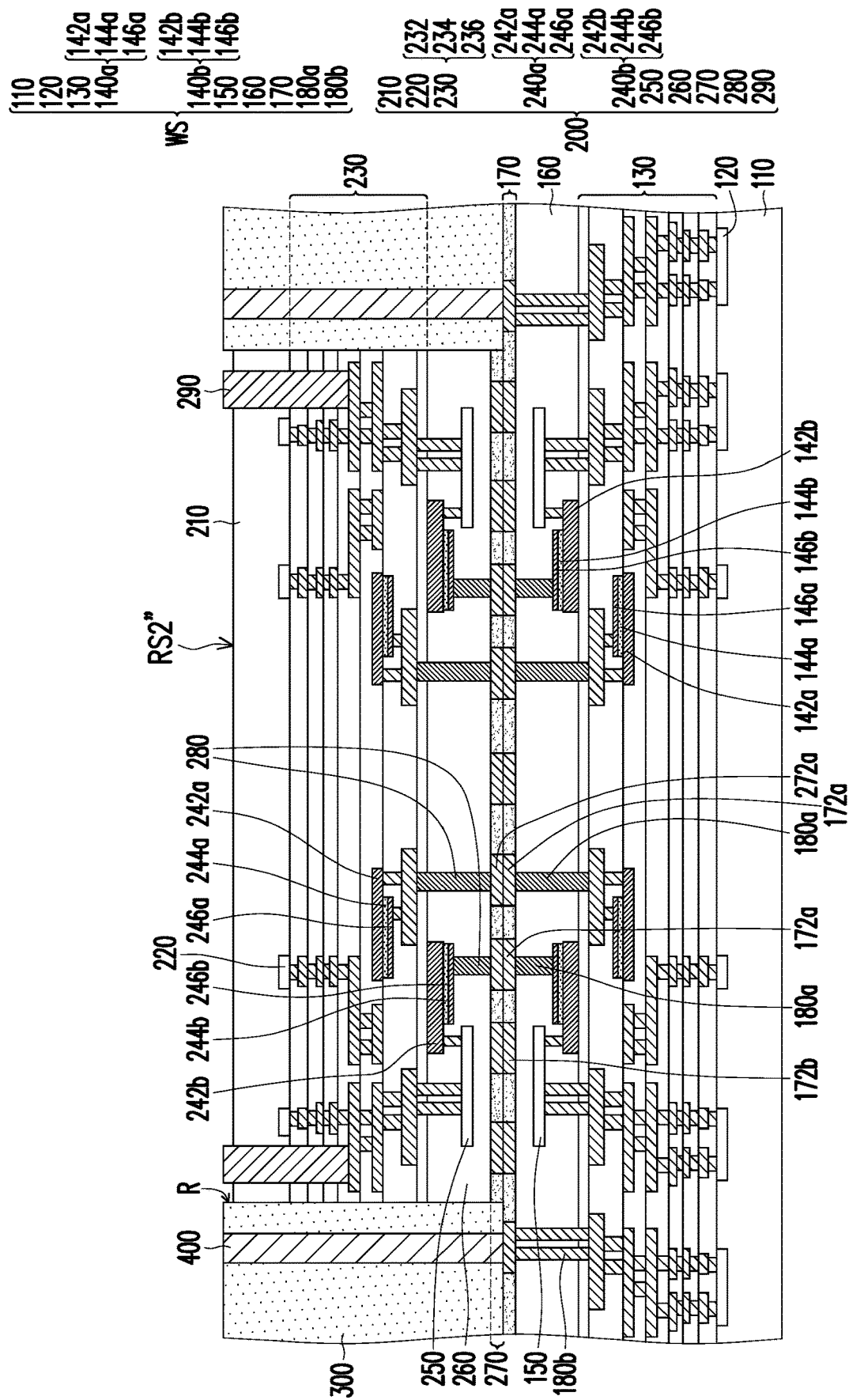
Figure 5K:
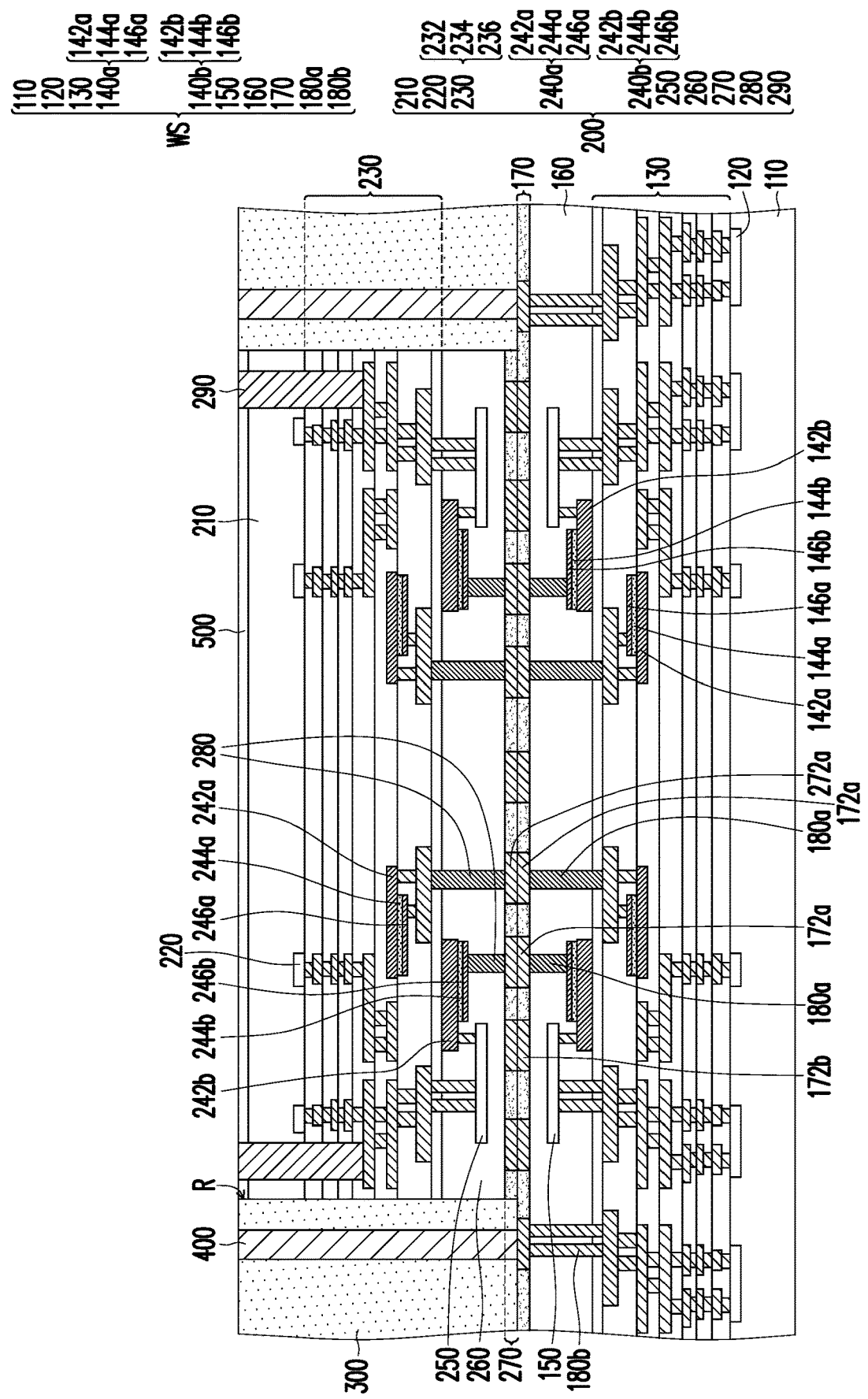
Figure 5L:
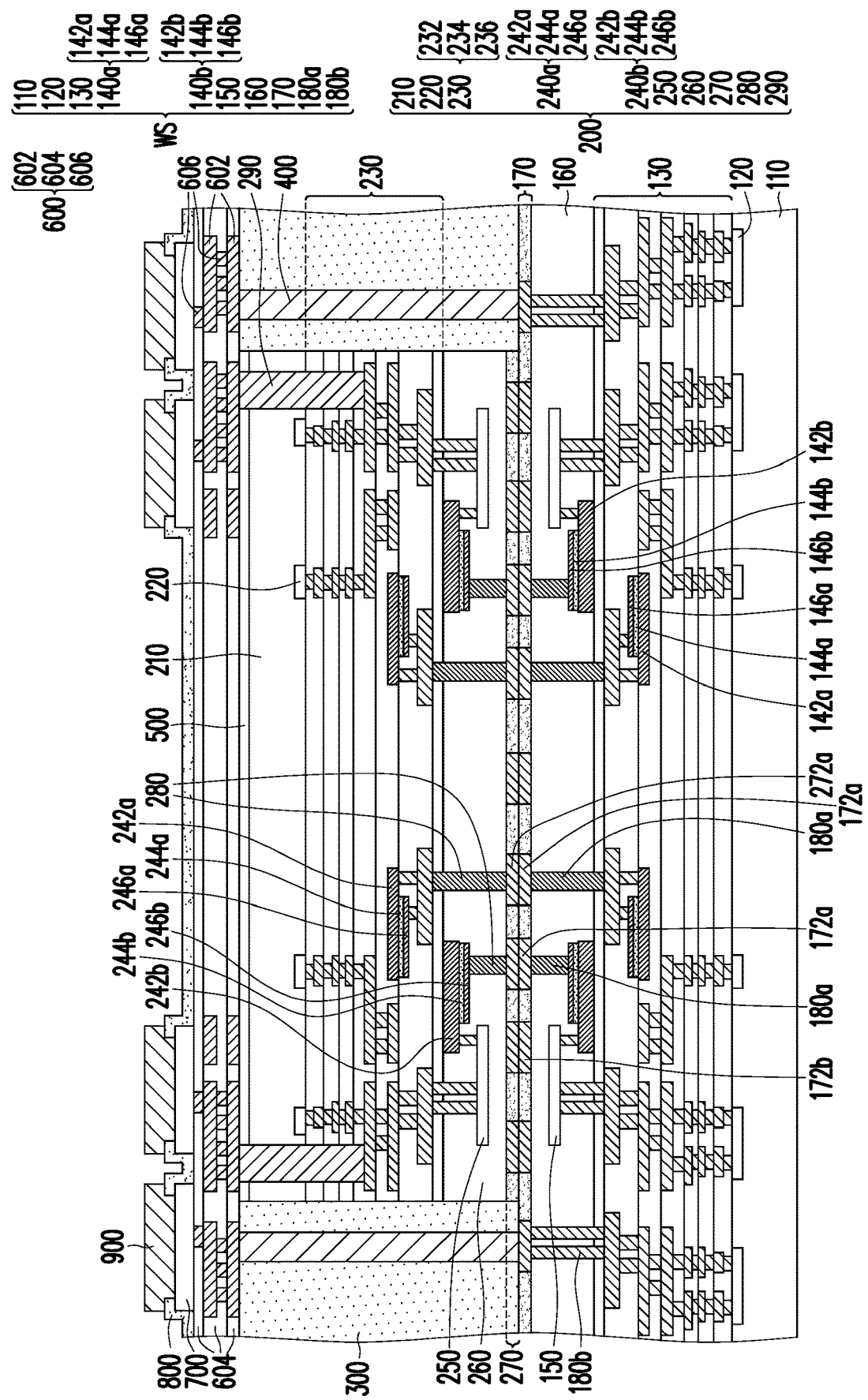
Figure 5M:
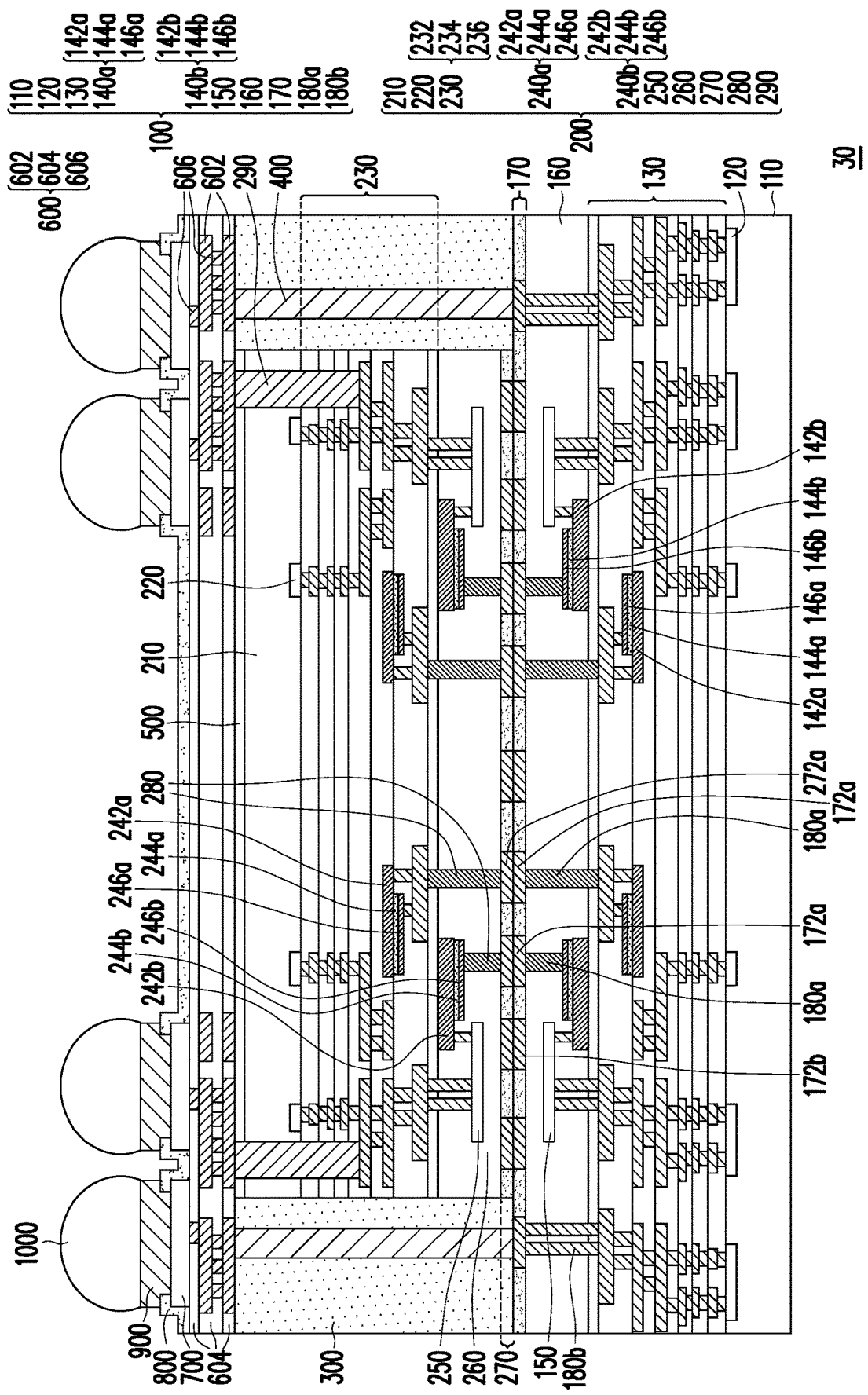

Referring to FIG. 5G, a die 200 is provided. In some embodiments, the die 200 includes a semiconductor substrate 210, a plurality of devices 220, an interconnection structure 230, a plurality of capacitors 240a, a plurality of capacitors 240b, a plurality of conductive pads 250, a passivation layer 260, a bonding layer 270, a plurality of bonding vias 280, and a plurality of through semiconductor vias (TSV) 290. The semiconductor substrate 210 and the devices 220 of the die 200 are respectively similar to the semiconductor substrate 110 and the devices 110 of the wafer substrate WS, so the detailed descriptions thereof are omitted herein.

As illustrated in FIG. 5G, the interconnection structure 230 is disposed on the semiconductor substrate 210. In some embodiments, the interconnection structure 230 includes a plurality of conductive patterns 232, a plurality of dielectric layers 234, and a plurality of conductive vias 236. The conductive patterns 232, the dielectric layers 234, and the conductive vias 236 of the interconnection structure 230 are respectively similar to the conductive patterns 132, the dielectric layers 134, and the conductive vias 136 of the interconnection structure 130, so the detailed descriptions thereof are omitted herein.

In some embodiments, the capacitors 240a are embedded in the interconnection structure 230. As illustrated in FIG. 5G, each capacitor 240a includes a metal layer 242a, an insulating layer 244a, and a metal layer 246a stacked in sequential order. In some embodiments, the metal layer 242a, the insulating layer 244a, and the metal layer 246a of the capacitor 240a are respectively similar to the metal layer 142a, the insulating layer 144a, and the metal layer 146a of the capacitor 140a, so the detailed descriptions thereof are omitted herein.

In some embodiments, the capacitors 240b, the conductive pads 250, the passivation layer 260, and the bonding vias 280 are formed over the interconnection structure 230. In some embodiments, the capacitors 240b, the conductive pads 250, the passivation layer 260, and the bonding vias 280 of the die 200 are respectively similar to the capacitors 140b, the conductive pad 150, the passivation layer 160, and the bonding via 180a of the wafer substrate WS, so the detailed descriptions thereof are omitted herein.

In some embodiments, the capacitors 240b are embedded in the passivation layer 260. In other words, the capacitors 240b and the capacitors 240a are located at different level heights. In some embodiments, the capacitors 240b are electrically connected to the capacitors 240a. However, the disclosure is not limited thereto. In some alternative embodiments, the capacitors 240b are electrically isolated from the capacitors 240a. As illustrated in FIG. 5G, each capacitor 240b includes a metal layer 242b, an insulating layer 244b, and a metal layer 246b stacked in sequential order. In some embodiments, the metal layer 242b, the insulating layer 244b, and the metal layer 246b of the capacitor 240b are respectively similar to the metal layer 142b, the insulating layer 144b, and the metal layer 146b of the capacitor 140b, so the detailed descriptions thereof are omitted herein.

In some embodiments, the conductive pads 250 are electrically connected to the interconnection structure 230. In some embodiments, the conductive pads 250 are embedded in the passivation layer 260. As illustrated in FIG. 5G, some of the bonding vias 280 are formed to penetrate through the passivation layer 260 to establish electrical connection with the capacitors 240b. On the other hand, the rest of the bonding vias 280 are formed to penetrate through the passivation layer 260 and the bottommost dielectric layer 234 of the interconnection structure 230 to establish electrical connection with the capacitors 240a.

As illustrated in FIG. 5G, the bonding layer 270 is formed over the passivation layer 260 and the bonding vias 280. In other words, the passivation layer 260 is sandwiched between the interconnection structure 230 and the bonding layer 270. In some embodiments, the bonding layer 270 includes a plurality of bonding pads 272a, a plurality of bonding pads 272b, and a dielectric layer 274. The bonding pads 272a, the bonding pads 272b, and the dielectric layer 274 of the bonding layer 270 are respectively similar to the bonding pads 172a, the bonding pads 172b, and the dielectric layer 174 of the bonding layer 170, so the detailed descriptions thereof are omitted herein. In some embodiments, the bonding layer 270 may further include a plurality of dummy bonding pads (not shown). In some embodiments, the dummy bonding pads may be electrically floating and may serve the purpose of maintaining metal distribution to control warpage. In some embodiments, the die 200 further includes additional bonding vias (not shown) connecting the bonding pads 272b and the conductive patterns 232 of the interconnection structure 230.

In some embodiments, the TSVs 290 are embedded in the semiconductor substrate 210 and the dielectric layers 234 of the interconnection structure 230. That is, the TSVs 290 extend from the semiconductor substrate 210 to the interconnection structure 230. For example, a portion of each TSV 290 is embedded in the semiconductor substrate 210 while another portion of each TSV 290 is embedded in the dielectric layers 234 of the interconnection structure 230. In some embodiments, the TSVs 290 are directly in contact with the conductive patterns 232 to render electrical connection with the interconnection structure 230.

In some embodiments, the die 200 may be capable of performing storage functions. For example, the die 200 may be Dynamic Random Access Memory (DRAM), Resistive Random Access Memory (RRAM), Static Random Access Memory (SRAM), or the like. However, the disclosure is not limited thereto. In some alternative embodiments, the die 200 may be Central Process Unit (CPU) dies, Graphic Process Unit (GPU) dies, Field-Programmable Gate Array (FPGA), or the like.

As illustrated in FIG. 5G, bottom surfaces of the bonding pads 272a, bottom surfaces of the bonding pads 272b, and a bottom surface of the dielectric layer 274 may be collectively referred to as an active surface AS2 of the die 200. On the other hand, a surface of the die 200 opposite to the active surface AS2 may be referred to as a rear surface RS2 of the die 200. As shown in FIG. 5G, the bottom surfaces of the bonding pads 272a, the bottom surfaces of the bonding pads 272b, and the bottom surface of the dielectric layer 274 are substantially located at the same level height to provide an appropriate active surface AS2 for hybrid bonding.

As illustrated in FIG. 5G, the die 200 is placed on the wafer substrate WS such that the die 200 is bonded to the wafer substrate WS. For simplicity, one die 200 is shown in FIG. 5G. However, it should be understood that more than one dies may be bonded to the wafer substrate WS. In some embodiments, the die 200 may be bonded to the wafer substrate WS through a hybrid bonding process. The hybrid bonding process in FIG. 5G is similar to the hybrid bonding process in FIG. 1F, so the detailed description thereof is omitted herein.

As illustrated in FIG. 5G, each capacitor 240a is overlapped with the corresponding capacitor 140a along a vertical direction perpendicular to the active surface AS2 of the die 200. That is, a vertical projection of the capacitor 240a is overlapped with the capacitor 140a. Similarly, each capacitor 240b is overlapped with the corresponding capacitor 140b along the vertical direction perpendicular to the active surface AS2 of the die 200. That is, a vertical projection of the capacitor 240b is overlapped with the capacitor 140b. In some embodiments, the capacitor 140a and the capacitor 240a are arranged in mirror symmetry. Similarly, the capacitor 140b and the capacitor 240b are arranged in mirror symmetry. In some embodiments, the capacitor 140a is electrically connected to the corresponding capacitor 240a through part of the interconnection structure 130, the bonding via 180a, the bonding layer 170, the bonding layer 270, and the bonding via 280. For example, the capacitor 140a is electrically connected to the corresponding capacitor 240a sequentially through the conductive vias 136, the conductive pattern 132, the bonding via 180a, the bonding pads 172a, the bonding pads 272a, and the bonding via 280. On the other hand, the capacitor 140b is electrically connected to the corresponding capacitor 240b through the bonding via 180a, the bonding layer 170, the bonding layer 270, and the bonding via 280. For example, the capacitor 140b is electrically connected to the corresponding capacitor 240b sequentially through the bonding via 180a, the bonding pads 172a, the bonding pads 272a, and the bonding via 280. In some embodiments, the capacitors 140a, the capacitor 140b, the capacitor 240a, and the capacitor 240b are electrically connected. For example, the capacitor 140a, the capacitor 140b, the capacitor 240a, and the capacitor 240b are connected in series to form a passive device (i.e. another capacitor). The passive device has an effective capacitance substantially equal to a sum of the capacitances of the capacitor 140a, the capacitor 140b, the capacitor 240a, and the capacitor 240b. In other words, the capacitor 140a may be referred to as a first portion of the passive device, the capacitor 240a may be referred to as a second portion of the passive device, the capacitor 140b may be referred to as a third portion of the passive device, and the capacitor 240b may be referred to as a third portion of the passive device. In some embodiments, the passive device extends from the die 200 to the wafer substrate WS. That is, the passive device may be referred to as "dual side stacking MIM structure." Since the passive device is constituted by the capacitors 140a, 140b located in the wafer substrate WS and the capacitors 240a, 240b located in the die 200, and the capacitors 140a, 140b and the capacitors 240a, 240b are arranged in a stacked manner, the area requirement for the individual capacitor 140a, the individual capacitor 140b, the individual capacitor 240a, and the individual capacitor 240b may be sufficiently reduced to render desired effective capacitance in the passive device. As such, the obtained package may be miniaturized, and more components may be integrated into a given area.

Referring to FIG. 5H to FIG. 5M, the steps in FIG. 5H to FIG. 5M are similar to the steps shown in FIG. 1G to FIG. 1L, so similar elements are denoted by similar reference numerals, and the detailed descriptions thereof are omitted herein. In some embodiments, the die 200 is stacked on and bonded to the die 100. In other words, multiple dies 100 and 200 are integrated into a single package 30. As such, the package 30 may be referred to as a "SOIC package." In some embodiments, the capacitors 140a are embedded in the interconnection structure 130 and the capacitors 140b are embedded in the passivation layer 160. In other words, the die 100 has capacitors 140a, 140b embedded therein. Similarly, the die 200 has capacitors 240a, 240b embedded therein. In some embodiments, the capacitor 140a and the capacitor 240a are overlapped with each other and are arranged in a stacked manner. Similarly, the capacitor 140b and the capacitor 240b are overlapped with each other and are arranged in a stacked manner. As such, the area requirement for the individual capacitor 140a, the individual capacitor 140b, the individual capacitor 240a, and the individual capacitor 240b may be sufficiently reduced to render desired effective capacitance. Therefore, the package 30 may be miniaturized, and more components may be integrated into a given area.

Figure 6:
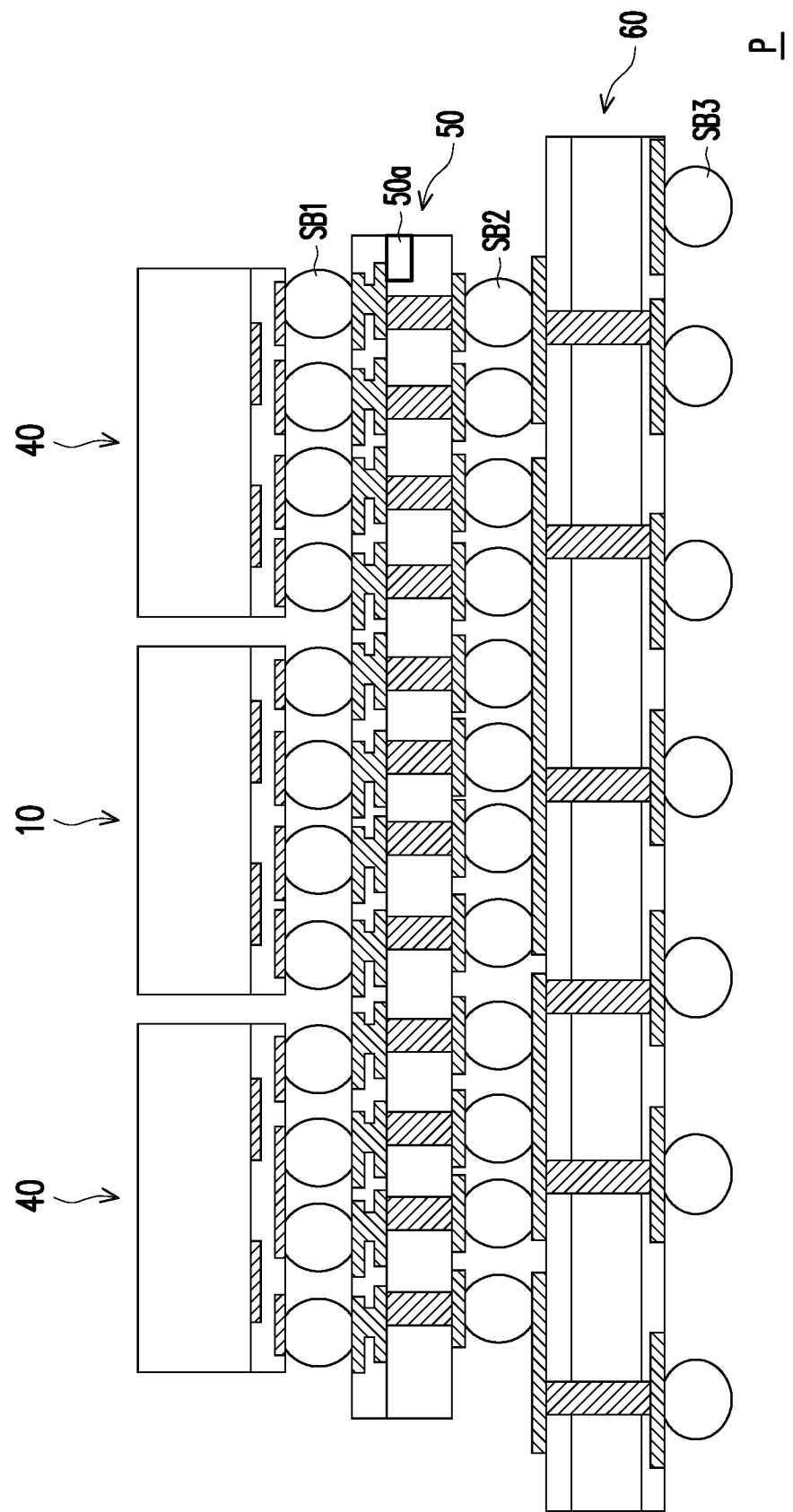
FIG. 6 is a schematic view of a package structure P.

FIG. 6 is a schematic view of a package structure P. In some embodiments, the package 10 in FIG. 1L may be utilized in the package structure P. In some embodiments, the package structure P includes the package 10, a plurality of chips 40, an interposer 50, and a substrate 60. In some embodiments, the package 10 and the chips 40 are disposed on the interposer 50. On the other hand, the interposer 50 is disposed on the substrate 60. In some embodiments, the chip 400 may be Dynamic Random Access Memory (DRAM), Resistive Random Access Memory (RRAM), Static Random Access Memory (SRAM), or the like. In some embodiments, the package 10 and the chips 40 are electrically connected to the interposer 50 through connectors SB1. In some embodiments, the connectors SB1 may be micro bumps. Similarly, the interposer 50 is electrically connected to the substrate 60 through connectors SB2. In some embodiments, the connectors SB2 may be C4 bumps. In some embodiments, a plurality of connectors SB3 may be formed on the substrate 60 opposite to the interposer 50 for external electrical connection. In some embodiments, the connectors SB3 may be solder balls. In some embodiments, the package structure P may be referred to as a "chip on wafer on substrate (CoWoS)" structure.

In some embodiments, the interposer 50 includes a deep trench capacitor (DTC) 50a embedded therein. In some embodiments, by allowing the MIM capacitors (i.e. the capacitors 140, 240) in the package 10 to be close to the DTC 50a in the interposer 50, the performance of the package structure P may be sufficiently enhanced. For example, a distance between the MIM capacitor of the package 10 and the DTC 50a may be less than 2 μm to render excellent electrical performance of the package structure P. It should be noted that although FIG. 6 illustrated that the package structure P includes the package 10, the disclosure is not limited thereto. In some alternative embodiments, the package 10 may be replaced by the package 20 in FIG. 3L or the package 30 in FIG. 5M.

In accordance with some embodiments of the disclosure, a package includes a first die, a second die, an encapsulant, and a redistribution structure. The first die has a first capacitor embedded therein. The second die has a second capacitor embedded therein. The second die is stacked on the first die. The first capacitor is electrically connected to the second capacitor. The encapsulant laterally encapsulates the second die. The redistribution structure is disposed on the second die and the encapsulant.

In accordance with some alternative embodiments of the disclosure, a package includes a first die, a second die, and an encapsulant. The first die includes a first semiconductor substrate, a first interconnection structure, and a first bonding layer. The first interconnection structure is disposed on the first semiconductor substrate. The first interconnection structure includes a first capacitor embedded therein. The first bonding layer is disposed over the first interconnection structure. The second die is stacked on the first die. The second die includes a second semiconductor substrate, a second interconnection structure, and a second bonding layer. The second interconnection structure is disposed on the second semiconductor substrate. The second interconnection structure includes a second capacitor embedded therein. The second bonding layer is disposed over the second interconnection structure. The first capacitor is electrically connected to the second capacitor through the first bonding layer and the second bonding layer. The encapsulant laterally encapsulates the second die.

In accordance with some embodiments of the disclosure, a manufacturing method of a package includes at least the following steps. A wafer substrate having a first interconnection structure, first bonding vias and a first bonding layer is provided. A first portion of a passive device is formed in the first interconnection structure. The first bonding vias electrically connect the first bonding layer and the first portion of the passive device. A die having a second interconnection structure, second bonding vias, and a second bonding layer is provided. A second portion of the passive device is formed in the second interconnection structure. The second bonding vias electrically connect the second bonding layer and the second portion of the passive device. The first bonding layer of the wafer substrate is bonded to the second bonding layer of the die such that the first portion of the passive device is electrically connected to the second portion of the passive device. The die is laterally encapsulated by an encapsulant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:
   a first die comprising a first capacitor;
   a second die comprising a second capacitor, wherein the second die is stacked on the first die, the first capacitor is spatially separated from the second capacitor, and the first capacitor is electrically connected to the second capacitor; and
   an encapsulant laterally encapsulating the second die.

2. The package of claim 1, wherein the first die further comprises:
   a first interconnection structure, wherein the first capacitor is embedded in the first interconnection structure;
   a first bonding layer disposed over the first interconnection structure;
   a passivation layer sandwiched between the first interconnection structure and the first bonding layer;
   conductive pads embedded in the passivation layer; and
   bonding vias penetrating through the passivation layer to connect the first bonding layer and the first capacitor.

3. The package of claim 2, wherein the first capacitor comprises a bottom metal layer, an insulating layer, and a top metal layer stacked in sequential order, one of the bonding vias is directly in contact with the top metal layer, and another one of the bonding vias is directly in contact with the bottom metal layer.

4. The package of claim 3, wherein the first interconnection structure comprises dielectric layers and conductive patterns embedded in the dielectric layers, and a material of the dielectric layers of the first interconnection structure is different from a material of the insulating layer of the first capacitor.

5. The package of claim 2, wherein the first capacitor comprises a bottom metal layer, an insulating layer, and a top metal layer stacked in sequential order, the insulating layer and the top metal layer comprise an opening exposing the bottom metal layer, and at least one of the bonding vias extends into the opening to contact the bottom metal layer.

6. The package of claim 2, wherein the first die further comprises a third capacitor embedded in the passivation layer, and the third capacitor is electrically connected to the first capacitor and the second capacitor.

7. The package of claim 1, further comprising:
a redistribution structure disposed on the second die and the encapsulant; and
through insulating vias (TIV) electrically connecting the first die and the redistribution structure.

8. The package of claim 7, wherein the second die further comprises a semiconductor substrate, through semiconductor vias (TSV) penetrating through the semiconductor substrate, and a second interconnection structure disposed on the semiconductor substrate, and the TSVs electrically connect the second interconnection structure and the redistribution structure.

9. A package, comprising:
a first die, comprising:
a first interconnection structure; and
a second die stacked on the first die, comprising:
a second interconnection structure;
a passive device, comprising a first MIM structure and a second MIM structure electrically connected to the first MIM structure, wherein the first MIM structure is embedded in the first interconnection structure, the second MIM structure is embedded in the second interconnection structure, and the first MIM structure comprises a bottom metal layer, an insulating layer, and a top metal layer stacked in sequential order; and
an encapsulant laterally encapsulating the second die.

10. The package of claim 9, wherein the first interconnection structure comprises dielectric layers and conductive patterns embedded in the dielectric layers, and a material of the dielectric layers of the first interconnection structure is different from a material of the insulating layer.

11. The package of claim 9, wherein the first die further comprises first bonding vias partially embedded in the first interconnection structure, the insulating layer and the top metal layer comprise an opening exposing the bottom metal layer, and at least one of the first bonding vias extends into the opening to contact the bottom metal layer.

12. The package of claim 9, further comprising:
a redistribution structure disposed on the second die and the encapsulant; and
through insulating vias (TIV) penetrating through the encapsulant, wherein the TIVs electrically connect the first die and the redistribution structure.

13. The package of claim 12, wherein the first die further comprises first bonding vias partially embedded in the first interconnection structure and first bonding pads over the first interconnection structure, the second die further comprises second bonding vias partially embedded in the second interconnection structure and second bonding pads over the second interconnection structure, the first bonding vias are connected to the first bonding pads, the second bonding vias are connected to the second bonding pads, and sidewalls of each first bonding pad are aligned with sidewalls of the corresponding second bonding pad.

14. The package of claim 13, wherein the first die further comprises third bonding pads levelled with the first bonding pads, and the TIVs are in direct contact with the third bonding pads.

15. A manufacturing method of a package, comprising:
providing a wafer substrate having a first interconnection structure, wherein a first capacitor is formed in the first interconnection structure;
providing a die having a second interconnection structure, wherein a second capacitor is formed in the second interconnection structure;
bonding the die to the wafer substrate such that the first capacitor is electrically connected to the second capacitor; and
laterally encapsulating the die by an encapsulant.

16. The method of claim 15, wherein the first capacitor comprises a bottom metal layer, an insulating layer, and a top metal layer stacked in sequential order, the first interconnection structure comprises dielectric layers and conductive patterns embedded in the dielectric layers, and the bottom metal layer of the first capacitor and one of the conductive patterns are simultaneously formed.

17. The method of claim 16, wherein the wafer substrate further comprises bonding vias partially embedded in the first interconnection structure, and providing the wafer substrate further comprises:
forming an opening in the top metal layer and the insulating layer to expose the bottom metal layer, wherein at least one of the bonding vias extends into the opening to contact the bottom metal layer.

18. The method of claim 15, wherein providing the wafer substrate further comprises:
forming a third capacitor over the first interconnection structure; and
forming a first passivation layer on the first interconnection structure to cover the third capacitor.

19. The method of claim 18, wherein providing the dies further comprises:
forming a fourth capacitor over the second interconnection structure; and
forming a second passivation layer on the second interconnection structure to cover the fourth capacitor.

20. The method of claim 15, further comprising:
forming a redistribution structure over the die and the encapsulant; and
forming through insulating vias (TIV) penetrating through the encapsulant, wherein the TIVs electrically connect the wafer substrate and the redistribution structure.

* * * * *